United States Patent
Lai et al.

(10) Patent No.: US 12,205,889 B2
(45) Date of Patent: Jan. 21, 2025

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Cheng-Hsien Lai, Hsinchu (TW); Shih-Ming Chen, Miaoli (TW); Han-Chang Hsieh, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 571 days.

(21) Appl. No.: 17/461,998

(22) Filed: Aug. 31, 2021

(65) Prior Publication Data
US 2023/0069734 A1 Mar. 2, 2023

(51) Int. Cl.
*H01L 23/522* (2006.01)
*H01F 27/29* (2006.01)
*H01L 21/768* (2006.01)
*H01L 49/02* (2006.01)

(52) U.S. Cl.
CPC ......... *H01L 23/5227* (2013.01); *H01F 27/29* (2013.01); *H01L 21/76898* (2013.01); *H01L 28/10* (2013.01)

(58) Field of Classification Search
CPC .......... H01L 23/5227; H01L 21/76898; H01L 28/10
See application file for complete search history.

(56) References Cited

U.S. PATENT DOCUMENTS

| | | | |
|---|---|---|---|
| 6,429,504 B1* | 8/2002 | Beaussart | H01L 23/5227 257/E21.022 |
| 7,705,421 B1* | 4/2010 | Yegnashankaran | H01L 23/5227 257/E21.022 |
| 11,380,627 B1* | 7/2022 | Chen | H01L 29/402 |
| 2004/0159888 A1* | 8/2004 | Kobayashi | H01L 27/1203 257/E21.703 |

(Continued)

OTHER PUBLICATIONS

Niknejad et al., "Analysis, Design, and Optimization of Spiral Inductors and Transformers for Si RF IC's", IEEE Journal of Solid-State Circuits, vol. 33, No. 10, Oct. 1998, pp. 1474-1477.

(Continued)

*Primary Examiner* — Nathan W Ha
(74) *Attorney, Agent, or Firm* — JCIPRNET

(57) ABSTRACT

A semiconductor device includes a semiconductor substrate, an interconnection layer and an inductor pattern. The interconnection layer is disposed on the semiconductor substrate. The inductor pattern is electrically connected to the interconnection layer. The inductor pattern includes a first conductive line joined with a first terminal, a second conductive line joined with a second terminal, and a plurality of conductive coils. The conductive coils are joining the first conductive line to the second conductive line, and includes an outer coil joined with the first conductive line, an inner coil joined with the second conductive line and the outer coil. The second conductive line is spaced apart from a first side of the inner coil in a first direction by distance Y, the second terminal is spaced apart from a second side of the inner coil in a second direction by distance X1, wherein X1>1.25Y.

20 Claims, 22 Drawing Sheets

(56) References Cited

U.S. PATENT DOCUMENTS

| | | | | |
|---|---|---|---|---|
| 2004/0195652 A1* | 10/2004 | Okada | H01L 23/5227 | 257/E21.022 |
| 2004/0195692 A1* | 10/2004 | Adan | H01L 23/66 | 257/E23.114 |
| 2005/0184357 A1* | 8/2005 | Chiba | H01L 27/0641 | 257/E21.022 |
| 2005/0258507 A1* | 11/2005 | Tseng | H01L 27/08 | 257/E27.026 |
| 2006/0097346 A1* | 5/2006 | Bong | H01L 28/10 | 257/E21.022 |
| 2006/0151851 A1* | 7/2006 | Pillai | H01L 23/5227 | 257/536 |
| 2007/0045860 A1* | 3/2007 | Nakamura | H01L 21/7682 | 257/776 |
| 2007/0052062 A1* | 3/2007 | Ding | H01L 27/0617 | 257/528 |
| 2007/0052511 A1* | 3/2007 | Loke | H03B 5/124 | 336/200 |
| 2007/0115084 A1* | 5/2007 | Beerling | H01F 21/04 | 336/62 |
| 2007/0138557 A1* | 6/2007 | Ipposhi | H01L 21/84 | 257/E21.703 |
| 2007/0181971 A1* | 8/2007 | Park | H01L 23/5227 | 257/E21.022 |
| 2007/0182521 A1* | 8/2007 | Lin | H01L 23/5227 | 336/200 |
| 2007/0217174 A1* | 9/2007 | Shen | H01L 23/5227 | 361/760 |
| 2008/0001699 A1* | 1/2008 | Gardner | H01F 41/34 | 336/200 |
| 2008/0012091 A1* | 1/2008 | Ding | H01L 27/0641 | 257/E27.009 |
| 2008/0042239 A1* | 2/2008 | Lin | H01L 21/76838 | 257/532 |
| 2008/0042289 A1* | 2/2008 | Lin | H01L 23/5222 | 438/623 |
| 2008/0044977 A1* | 2/2008 | Lin | H01L 23/642 | 257/E21.022 |
| 2008/0070339 A1* | 3/2008 | Power | H10B 61/00 | 257/E27.005 |
| 2008/0237789 A1* | 10/2008 | He | G06F 30/36 | 716/132 |
| 2009/0096094 A1* | 4/2009 | Tetani | H01L 23/3114 | 257/737 |
| 2009/0244866 A1* | 10/2009 | Kawano | H01F 27/40 | 336/200 |
| 2011/0156205 A1* | 6/2011 | Maki | H03F 3/45188 | 257/532 |
| 2011/0205028 A1* | 8/2011 | Pagani | H01L 21/67115 | 343/866 |
| 2012/0235275 A1* | 9/2012 | Cheng | H01L 23/5227 | 257/E29.325 |
| 2015/0028460 A1* | 1/2015 | Sharma | H01L 23/5283 | 257/664 |
| 2015/0048481 A1* | 2/2015 | Hashimoto | H01L 23/5225 | 257/531 |
| 2015/0084158 A1* | 3/2015 | Tsai | H03F 1/26 | 438/3 |
| 2015/0206934 A1* | 7/2015 | Funaya | H01L 24/06 | 438/3 |
| 2016/0035672 A1* | 2/2016 | Funaya | H01L 21/02164 | 438/381 |
| 2016/0197066 A1* | 7/2016 | Uchida | H01L 28/10 | 438/3 |
| 2016/0211220 A1* | 7/2016 | Lin | H01L 23/552 | |
| 2017/0025349 A1* | 1/2017 | Wood | H01L 23/481 | |
| 2017/0085228 A1* | 3/2017 | Abdo | H01L 21/565 | |
| 2017/0148732 A1* | 5/2017 | Kuwajima | H01L 24/48 | |
| 2017/0229393 A1* | 8/2017 | Hsieh | H01L 23/5227 | |
| 2017/0236790 A1* | 8/2017 | Chinnusamy | H01L 21/4853 | 438/126 |
| 2017/0345755 A1* | 11/2017 | Uchida | H01F 41/041 | |
| 2018/0182704 A1* | 6/2018 | Yeh | H01L 23/66 | |
| 2018/0190584 A1* | 7/2018 | Upadhyaya | H01L 28/10 | |
| 2018/0374794 A1* | 12/2018 | Tanaka | H01L 28/10 | |
| 2019/0180916 A1* | 6/2019 | Tseng | H01L 23/645 | |
| 2019/0200454 A1* | 6/2019 | Liu | H03H 7/0115 | |
| 2019/0252117 A1* | 8/2019 | Yu | H01F 17/0006 | |
| 2020/0035550 A1* | 1/2020 | Emerson | H01L 22/12 | |
| 2021/0074465 A1* | 3/2021 | Yen | H01L 28/10 | |
| 2021/0074466 A1* | 3/2021 | Yen | H01F 17/0006 | |
| 2021/0280352 A1* | 9/2021 | Küchenmeister | H01L 28/10 | |
| 2021/0313269 A1* | 10/2021 | Bhagavat | H01F 17/0033 | |
| 2021/0384122 A1* | 12/2021 | Leng | H01L 28/10 | |
| 2023/0023018 A1* | 1/2023 | Nakashiba | H01L 23/481 | |
| 2023/0065844 A1* | 3/2023 | Tang | H01L 24/08 | |
| 2023/0066895 A1* | 3/2023 | Park | H01L 25/0652 | |
| 2024/0014126 A1* | 1/2024 | Cheng | H01L 23/49816 | |

OTHER PUBLICATIONS

"Office Action of Taiwan Counterpart Application", issued on Nov. 8, 2022, p. 1-p. 5.

* cited by examiner

SEMICONDUCTOR DEVICE AND METHOD OF FABRICATING THE SAME

BACKGROUND

An inductor is a passive electrical component that can store energy in a magnetic field created by an electric current passing through it. Inductors may be utilized in a wide variety of integrated circuit applications including voltage regulators and many RF circuits. Inductors having relatively small values are often built directly on integrated circuits using existing integrated chip fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
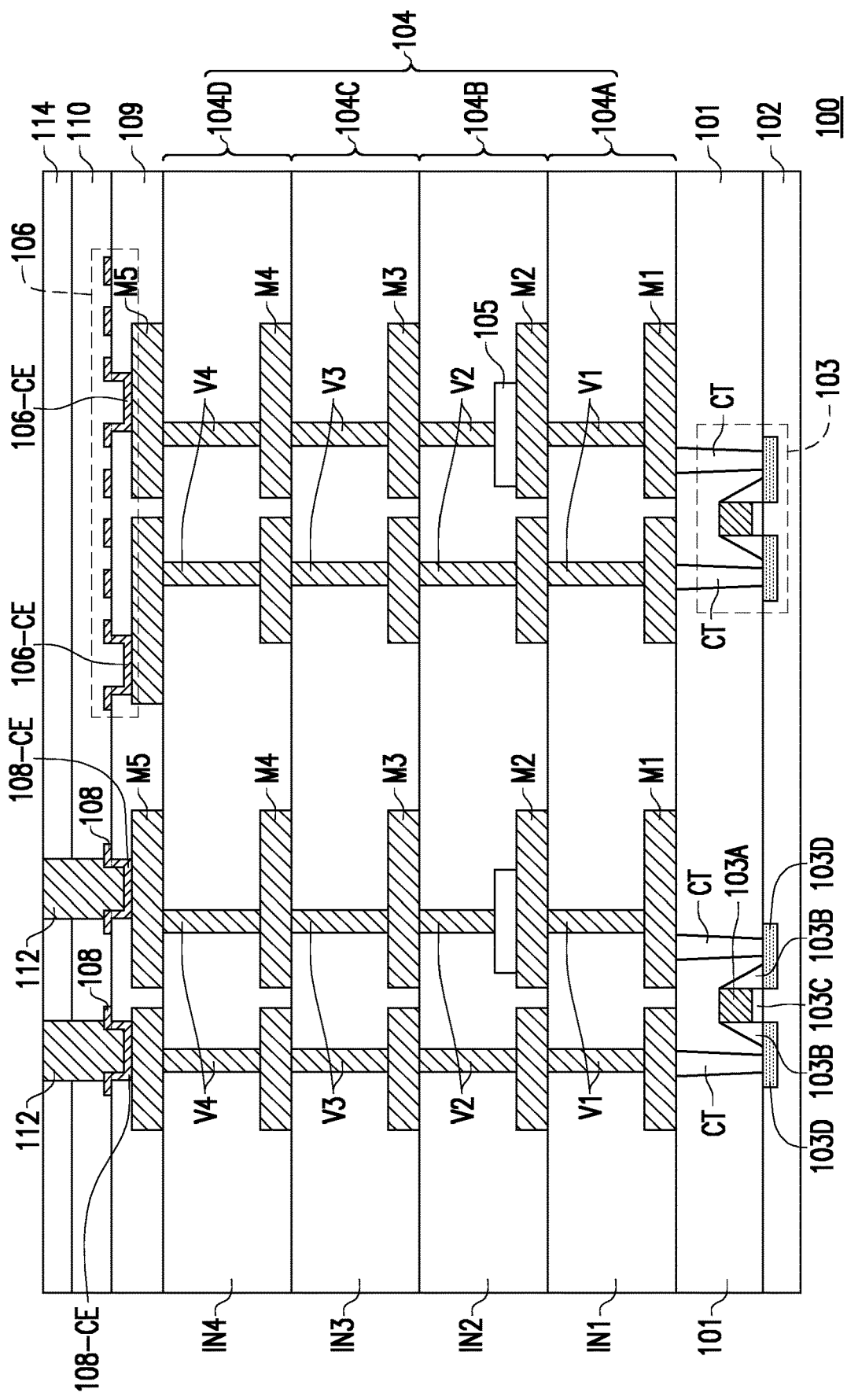
FIG. 1 is a schematic sectional view of a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a context, namely a method of fabricating a semiconductor device (or semiconductor die), which includes an inductor pattern therein. In conventional semiconductor devices having an inductor pattern embedded therein, during the fabrication of the device, a passivation crack is usually observed in the inductor area after an alloy process (high temperature heating). The crack caused by a high internal stress located in the inductor area due to small spacing at end point.

In accordance with some embodiments discussed herein, the dimensions of the inductor pattern are modified to help release the corner stress observed in the inductor area, and a passivation crack issue is resolved. For example, a second terminal width of the inductor pattern is increased, while the second terminal and a second conductive line joined with the second terminal satisfy a certain distance relationship (X1>1.25Y; X2>1.25Y; X3>1.25Y as exemplified below). As such, the inner stress of the inductor pattern may be reduced, while any internal stress remaining in the inductor pattern may be released through the second terminal having an enlarged width/area.

FIG. 1 is a schematic sectional view of a semiconductor device according to some exemplary embodiments of the present disclosure. As illustrated in FIG. 1, in some embodiments, a semiconductor device 100 (or semiconductor die) includes a semiconductor substrate 102, a dielectric layer 101, transistors 103 an interconnection layer 104, an inductor pattern 106, conductive pads 108, passivation layers 109, 110, conductive posts 112 and a protection layer 114. The dielectric layer 101 is disposed on the semiconductor substrate 102 and surrounds the transistor 103. The interconnection layer 104 is located on the semiconductor substrate 102 and electrically connected to the transistors 103 through conductive contacts CT.

In some embodiments, the interconnection layer 104 includes a first build-up layer 104A, a second build-up layer 104B, a third build-up layer 104C and a fourth build-up layer 104D. Each of the build-up layers (104A-104D) includes metallization layers (M1-M4), conductive vias (V1-V) and insulating layers (IN1-IN4). The interconnection layer 104 may further include a metallization layer M5 disposed on the fourth build-up layer 104D, whereby the passivation layer 109 covers the metallization layer M5.

The conductive pads 108 and the inductor pattern 106 are disposed on and electrically connected to the metallization layers (M1-M5) of the interconnection layer 104. The passivation layer 110 is disposed over the conductive pads 108 and the inductor pattern 106, and have openings that reveal the conductive pads 108. The conductive posts 112 are disposed on the passivation layer 110, and are electrically connected to the conductive pads 108 through the openings of the passivation layer 110. The protection layer 114 is disposed on the passivation layer 110 and surrounding the conductive posts 112. In some embodiments, the semiconductor device 100 is a radio frequency (RF) device. However, the disclosure is not limited thereto, and the semiconductor device 100 may be any other suitable types of devices having an inductor pattern embedded therein. The details of the inductor pattern 106 will be described with reference to FIG. 2

Figure 2:
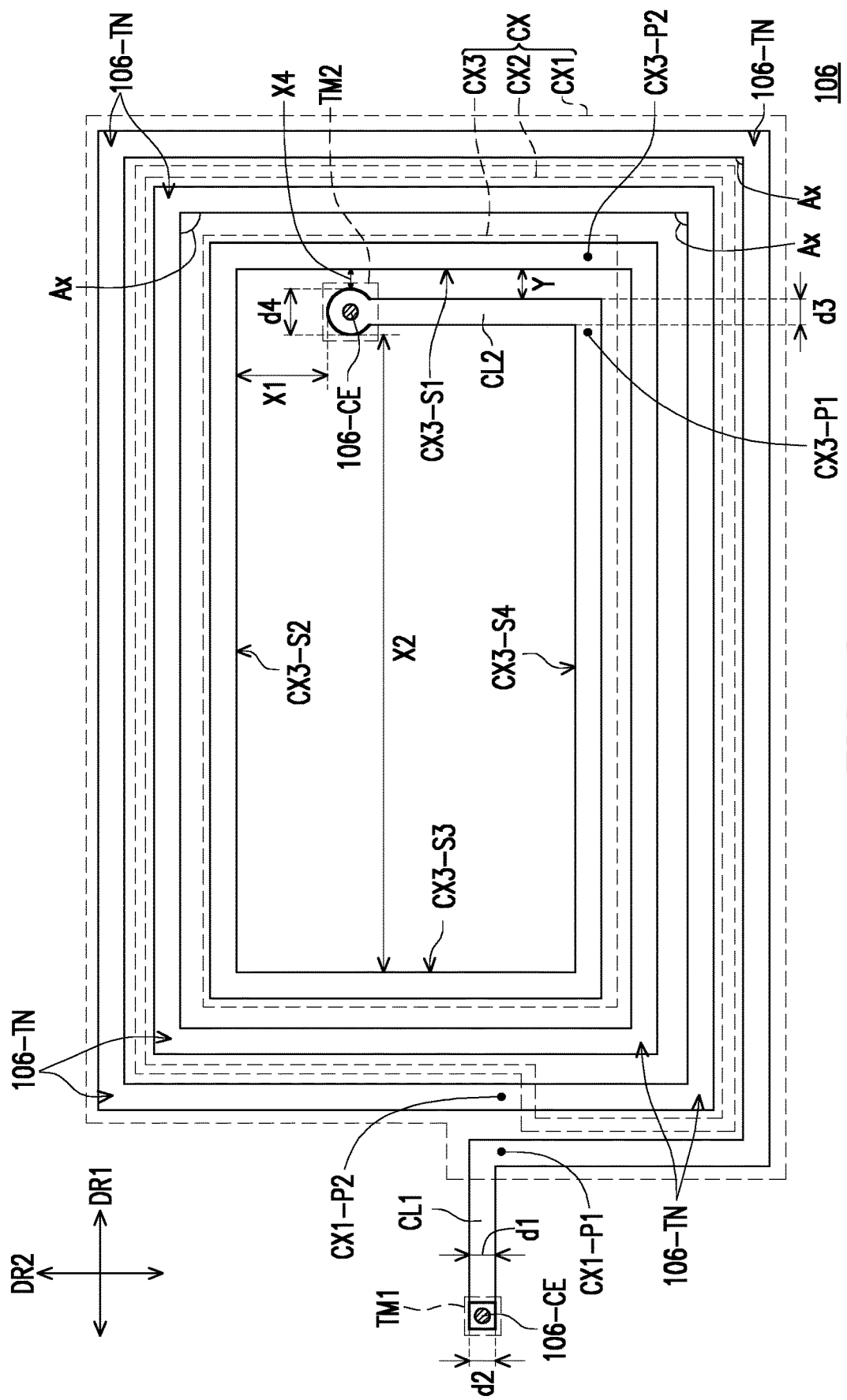
FIG. 2 is a top view of an inductor pattern according to some exemplary embodiments of the present disclosure.

FIG. 2 is a top view of an inductor pattern according to some exemplary embodiments of the present disclosure. As illustrated in FIG. 2, the inductor pattern 106 comprises a first terminal TM1, a first conductive line CL1, a second terminal TM2, a second conductive line CL2 and a plurality of conductive coils CX. The first terminal TM1 is disposed on the passivation layer 109 and electrically connected to the metallization layer M5 of the interconnection layer 104 (see FIG. 1). For example, the first terminal TM1 is connected to the metallization layer M5 through a connecting element 106-CE joined to a bottom surface of the first terminal TM1. The first conductive line CL1 is joined with the first terminal TM1. The second terminal TM2 is disposed on the passivation layer 109 and electrically connected to the metallization layer M5 of the interconnection layer 104 (see FIG. 1). For example, the second terminal TM2 is connected to the metallization layer M5 through a connecting element 106-CE joined to a bottom surface of the second terminal TM2. The second conductive line CL2 is joined with the second terminal TM2.

In some embodiments, a width of the first conductive line CL1 is d1, a width of the first terminal TM1 is d2, a width of the second conductive line CL2 is d3, and a width of the second terminal TM2 is d4. The width d4 is greater than the widths d1, d2 and d3. In other words, the second terminal TM2 has the greatest width, while the first terminal TM1, the first conductive line CL1 and the second conductive line CL2 have substantially equal widths. Furthermore, in some embodiments, the plurality of conductive coils CX has substantially equal widths with the first conductive line CL1 and the second conductive line CL2. By increasing the width of the second terminal TM2 relative to the width of the second conductive line CL2, an internal stress located in the inductor pattern 106 (inductor area) may be released, and a passivation crack issue may be resolved. Furthermore, by increasing the width of the second terminal relative to the widths of the plurality of conductive coils CX and the first conductive line CL1, an internal stress located in the inductor pattern 106 (inductor area) may be further released.

As further illustrated in FIG. 2 (and as supported in FIG. 1), the plurality of conductive coils CX is disposed on the passivation layer 109 and joining the first conductive line CL1 to the second conductive line CL2. The plurality of conductive coils CX comprises a plurality of coil turns 106-TN, and each of the plurality of coil turns 106-TN has an angle Ax of 90 degrees. Furthermore, the plurality of conductive coils CX comprises an outer coil CX1 joined with the first conductive line CL1, an inner coil CX3 joined with the second conductive line CL2, and intermediate coils CX2 joining the outer coil CX1 to the inner coil CX3.

In the exemplary embodiment, the outer coil CX1 is a portion of the inductor pattern 106 starting from the end of the first conductive line CL1 from point CX1-P1, which extends to the point CX1-P2 to form a single loop. Depending on the design of the first conductive line CL1, the start of the point CX1-P1 may be altered. For example, the first conductive line CL1 may have a plurality of segments that do not form parts of a coil pattern (a loop), while the point CX1-P1 is the starting point of the coil pattern (the loop) that forms part of the outer coil CX1. In a similar way, the inner coil CX3 is defined as a portion of the inductor pattern 106 starting from the end of the second conductive line CL2 from point CX3-P1, which extends to the point CX3-P2 to form a single loop. Depending on the design of the second conductive line CL2, the start of the point CX3-P1 may be altered. For example, the second conductive line CL2 may have at least one but not more than two segments, whereby at least one of the segments of the second conductive line CL2 may form parts of the coil pattern (a continuous loop). In the exemplary embodiment, the single segment of the second conductive line CL2 is arranged with the same angle as the coil turns 106-TN. Therefore, the segment of the second conductive line CL2 form parts of the coil pattern (the continuous loop), while the point CX3-P1 is the starting point of another loop joined with the second conductive line CL2 that forms part of the inner coil CX3. Furthermore, in some embodiments, the intermediate coils CX2 may be the remaining portions of the inductor pattern 106 joining the outer coil CX1 to the inner coil CX3, and may comprises a plurality of loops.

Although the conductive coils CX of the embodiment is illustrated as being inclusive of an outer coil CX1, an inner coil CX3 and intermediate coils CX2 with a certain number of loops, it is noted that the disclosure is not limited thereto. For example, the number of loops of the intermediate coils CX2 may be adjusted based on design requirements. In some embodiments, the intermediate coils CX2 may be omitted, and the outer coil CX1 is directly joined with inner coil CX3. In such an embodiment, the conductive coils CX will have two loops defined by the inner coil CX3 and the outer coil CX1. In other words, the conductive coils CX may have a minimum of two loops in the inductor pattern 106. Furthermore, in some embodiments, although the conductive coils CX are coiled up in an anti-clockwise fashion, it is noted that the disclosure is not limited thereto. In alternative embodiments, the conductive coils CX are coiled up in a clockwise, fashion, which may be adjusted based on design requirement.

As further illustrated in FIG. 2, the inner coil CX3 is shown to include a first side CX3-S1, a second side CX3-S2, a third side CX3-S3 and a fourth side CX3-S4. The first side CX3-S1 and the third side CX3-S3 are arranged along a first direction DR1, and are arranged to be opposite to one another. The second side CX3-S2 and the fourth side CX3-S4 are arranged along a second direction DR2, and are arranged to be opposite to one another. The second direction DR2 being perpendicular to the first direction DR1. In some embodiments, the four sides (CX3-S1, CX3-S2, CX3-S3, CX3-S4) of the inner coil CX3 surrounds the second conductive line CL2 and the second terminal TM2. In some embodiments, the second conductive line CL2 is spaced apart from the first side CX3-S1 of the inner coil CX3 in the first direction DR1 by distance Y, while the second terminal TM2 is spaced apart from the second side CX3-S2 of the inner coil CX3 in the second direction DR2 by distance X1. In some embodiments, the distance Y may correspond to a spacing of the conductive coils CX that may be substantially constant across the loops of the inner coil CX3, the outer coil CX1 and the intermediate coils CX2.

In some embodiments, the second terminal TM2 may be spaced apart from the first side CX3-S1 of the inner coil CX3 in the first direction by distance X4, whereby the distance X4 may be smaller than or equal to the distance Y. Furthermore, the second terminal TM2 is spaced apart from the third side CX3-S3 of the inner coil CX3 in the first direction DR1 by distance X2. In the exemplary embodiment, a relationship of the distance X1 to the distance Y satisfies: X1>1.25Y, and a relationship of the distance X2 to the distance Y satisfies: X2>1.25Y. For example, in one embodiment, if distance Y is 2 µm, then distance X1 would be greater than 2.5 µm, and distance X2 would be greater than 2.5 µm. By adjusting the second conductive line CL2 and the second terminal TM2 to satisfy such distance relationship, the inner stress of the inductor pattern 106 may be further reduced, and a passivation crack issue may be prevented. On the other hand, if such distance relationship is not satisfied, it would be likely that the inner stress is increased, resulting in a high possibility of passivation crack.

The fabrication process of the semiconductor device 100 having the inductor pattern 106 in accordance with some embodiments of the disclosure will be discussed in more detail by referring to the steps illustrated in FIG. 3A to FIG. 3H.

Figure 3A:
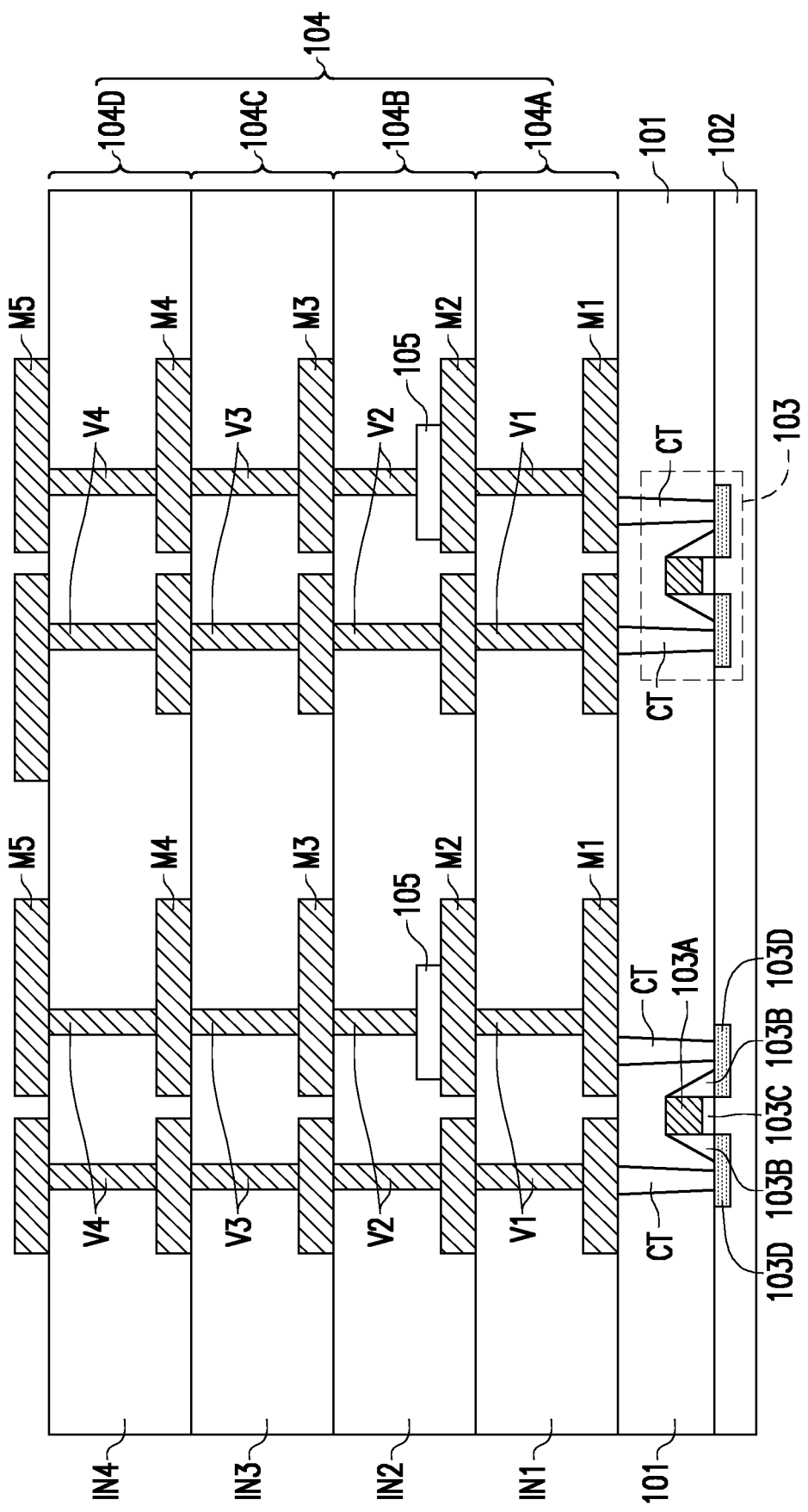
FIG. 3A to FIG. 3H are schematic sectional views of various stages in a method of fabricating a semiconductor device according to some exemplary embodiments of the present disclosure.

FIG. 3A to FIG. 3H are schematic sectional views of various stages in a method of fabricating a semiconductor device according to some exemplary embodiments of the present disclosure. As illustrated in FIG. 3A, a substrate 102 is provided. The substrate 102 may be, for example, a bulk substrate (e.g., a bulk silicon substrate), a silicon-on-insulator (SOI) substrate, or the like. The substrate 102 may be doped (e.g., with a p-type or an n-type dopant) or undoped. The substrate 102 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 102 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the substrate 102 further includes active components (e.g., transistors or the like) and optionally passive components (e.g., resistors, capacitors, inductors or the like) formed therein. In some other embodiments, the substrate 102 includes a wide variety of devices disposed thereon. The devices include integrated circuits devices. The devices are, for example, transistors, capacitors, resistors, diodes, photodiodes, fuse devices, or other similar devices. For example, in one embodiment, a plurality of transistors 103 is located within the substrate 102. The transistor 103 comprises a gate electrode 103A, transistor sidewall spacers 103B, a gate dielectric 103C, and source/drain regions 103D. Other devices, such as capacitors, resistors, diodes, photodiodes, fuses and the like may also be formed over the substrate 102. The functions of the devices may include memory, processors, sensors, amplifiers, power distribution, input/output circuitry, or the like.

As illustrated in FIG. 3A, an interconnection layer 104 is formed over the substrate 102. For example, the interconnection layer 104 is connected to the transistor 103 through conductive contacts CT. In some embodiments, a dielectric layer 101 is formed between the substrate 102 and the interconnection layer 104. The dielectric layer 101 may surround the conductive contacts CT, and surround the gate electrode 103A and transistor sidewall spacers 103B of the transistor 103.

As further illustrated in FIG. 3A. the interconnection layer 104 includes a first build-up layer 104A, a second build-up layer 104B, a third build-up layer 104C and a fourth build-up layer 104D. For example, the first build-up layer 104A includes a metallization layer M1 electrically connected to the conductive contacts CT, a plurality of conductive vias V1 disposed on the metallization layer M1, and an insulating layer IN1 (or inter-metal dielectric layer) laterally wrapping the conductive vias V1 and the metallization layer M1. The second build-up layer 104B is disposed on the first build-up layer 104A, and includes a metallization layer M2 electrically connected to the conductive vias V1, a plurality of conductive vias V2 disposed on the metallization layer M2, and an insulating layer IN2 (or inter-metal dielectric layer) laterally wrapping the conductive vias V2 and the metallization layer M2. In some embodiments, the second build-up layer 104B further includes a capacitor 105 disposed in between the conductive via V2 and the metallization layer M2. For example, in one embodiment, the capacitor 105 is a metal-insulator-metal (MIM) capacitor, which utilizes silicon nitride as the insulating material.

Furthermore, the third build-up layer 104C is disposed on the second build-up layer 104B, and includes a metallization layer M3 electrically connected to the conductive vias V2, a plurality of conductive vias V3 disposed on the metallization layer M3, and an insulating layer IN3 (or inter-metal dielectric layer) laterally wrapping the conductive vias V3 and the metallization layer M3. The fourth build-up layer 104D is disposed on the third build-up layer 104C, and includes a metallization layer M4 electrically connected to the conductive vias V3, a plurality of conductive vias V4 disposed on the metallization layer M4, and an insulating layer IN4 (or inter-metal dielectric layer) laterally wrapping the conductive vias V4 and the metallization layer M4. In addition, a metallization layer M5 is disposed on the fourth build-up layer 104D and electrically connected to the conductive vias V4. In the exemplary embodiment, although five metallization layers (M1-M5) and four build-up layers (104A~104D) are illustrated herein, it should be noted that the disclosure is not limited thereto. For example, in other embodiments the number of metallization layers and build-up layers in the interconnection layer 104 may be adjusted based on design requirements.

In some embodiments, the insulating layers IN1, IN2, IN3 and IN4 are independently made of a dielectric material, such as silicon oxide, silicon nitride, silicon oxynitride, a spin-on dielectric material, or a low-k dielectric material. The metallization layers M1, M2, M3, M4, M5 and the conductive vias V1, V2, V3, V4 may include metals or metal alloys including one or more of Al, AlCu, Cu, Ti, TiN, W, or the like. In some embodiments, the metallization layers M1, M2, M3, M4, M5 and the conductive vias V1, V2, V3, V4 are formed by a dual damascene process. That is, the metallization layers M1, M2, M3, M4, M5 and the conductive vias V1, V2, V3, V4 may be formed simultaneously.

Figure 3B:
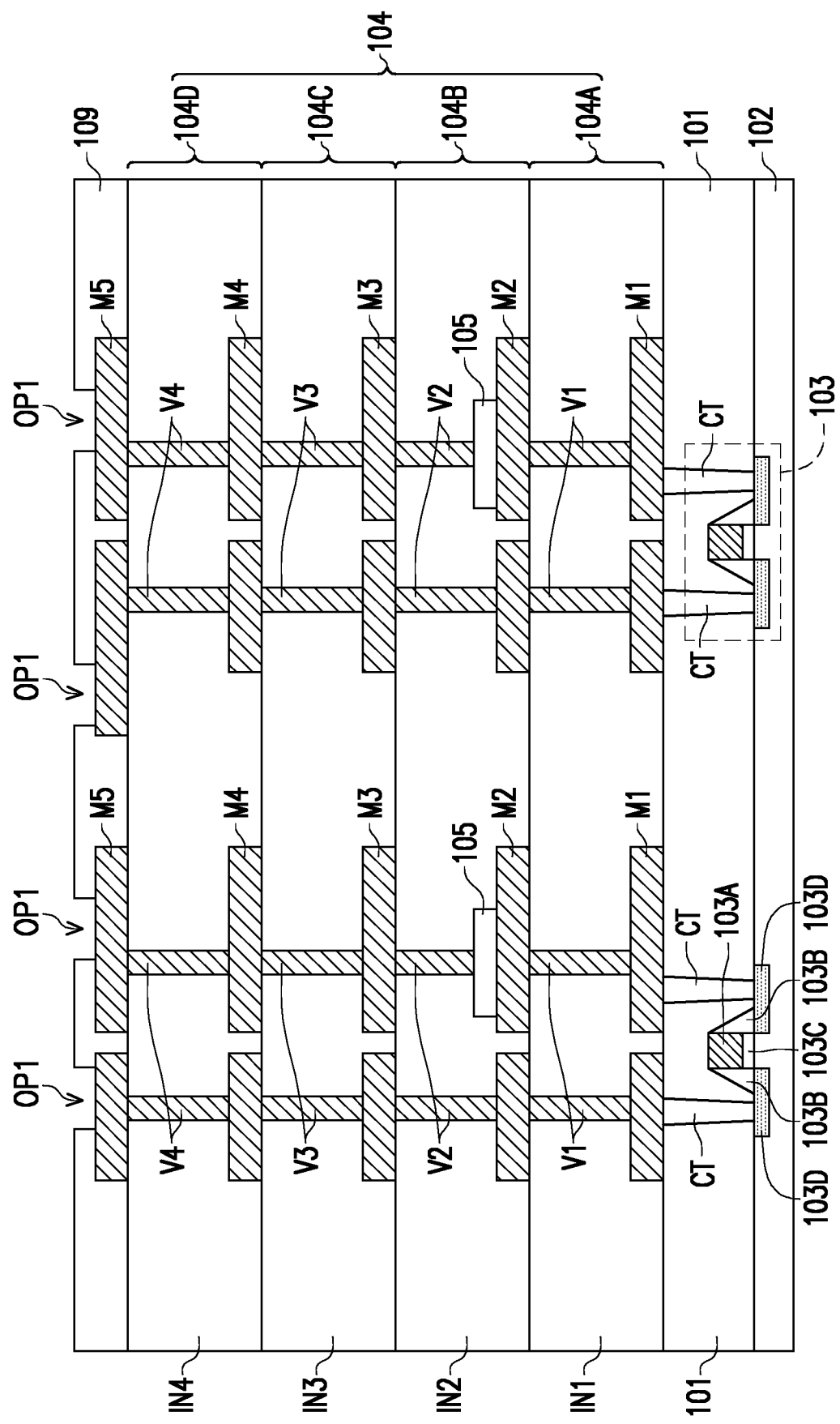

Referring to FIG. 3B, in a subsequent step, a passivation layer 109 (first passivation layer) is formed on the interconnection layer 104. For example, the passivation layer 109 is patterned to form a plurality of first openings OP1 partially revealing a top surface of the metallization layer M5 of the interconnection layer 104. In some embodiments, the patterning process is performed by providing a photoresist pattern (not shown) on the passivation layer 109. The photoresist pattern may cover up portions of the passivation layer 109, while revealing other portions of the passivation layer 109. Thereafter, portions of the passivation layer 109 not covered by the photoresist pattern may be etched to form the first openings OP1. In some embodiments, the passivation layer 109 is a silicon oxide layer, a silicon nitride layer, a silicon oxy-nitride layer or a dielectric layer formed of any suitable dielectric materials. In some embodiments, the passivation layer 109 may include an oxide layer and a silicon nitride layer stacked on the oxide layer. Furthermore, the passivation layer 109 may be formed by plasma enhanced chemical vapor deposition (PE-CVD), or the like.

Figure 3C:
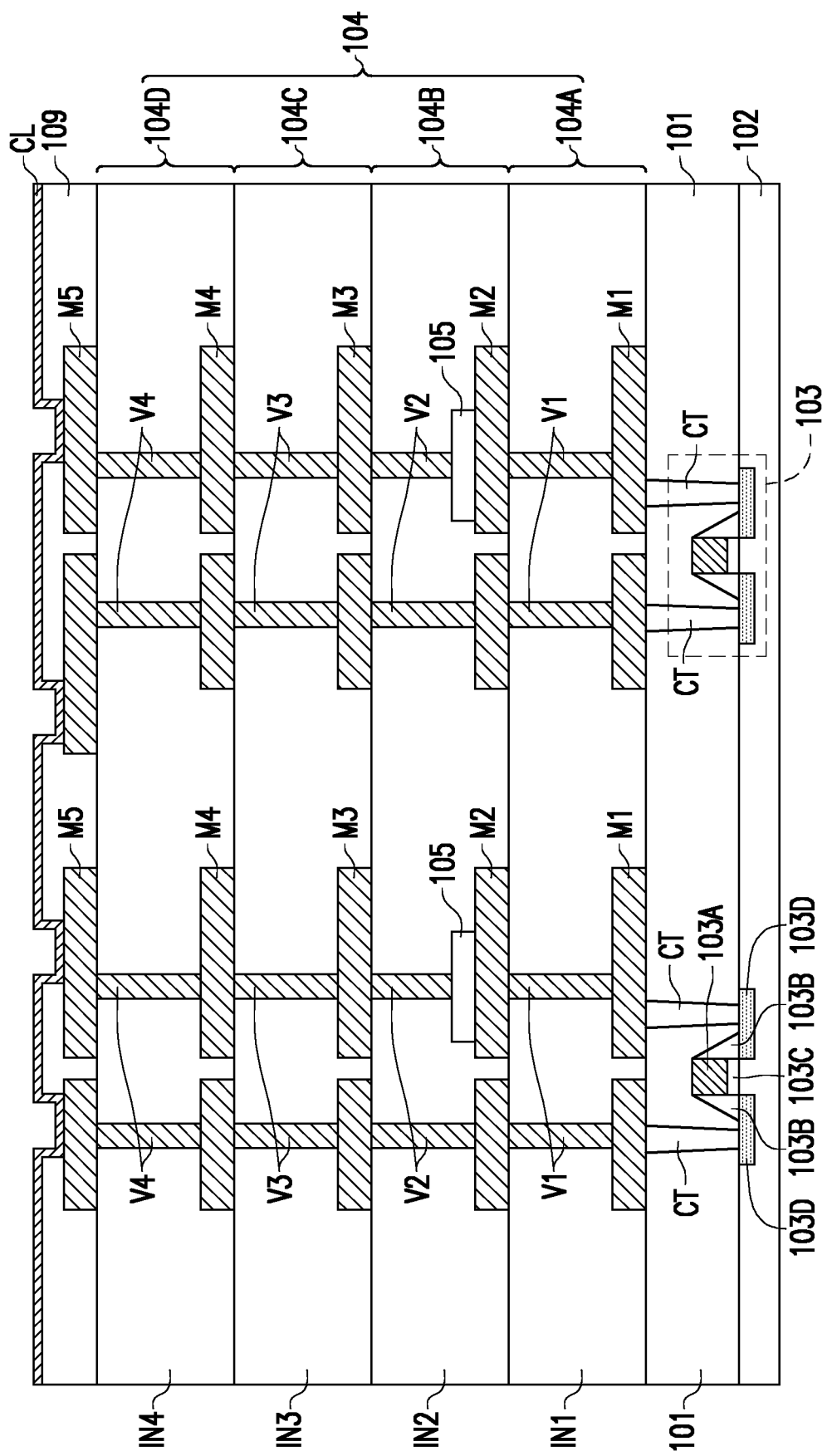

Referring to FIG. 3C, in some embodiments, a conductive layer CL is conformally formed over the passivation layer 109 and within the first openings OP1. For example, the conductive layer CL is electrically connected to the metallization layer M5 of the interconnection layer 104 through the first openings OP1. The conductive layer CL may include conductive materials such as Al, Cu, AlCu, or the like. Furthermore, the conductive layer CL may be formed by depositing conductive materials on the passivation layer 109 through a suitable process, such as by physical vapor deposition (PVD), or the like.

Figure 3D:
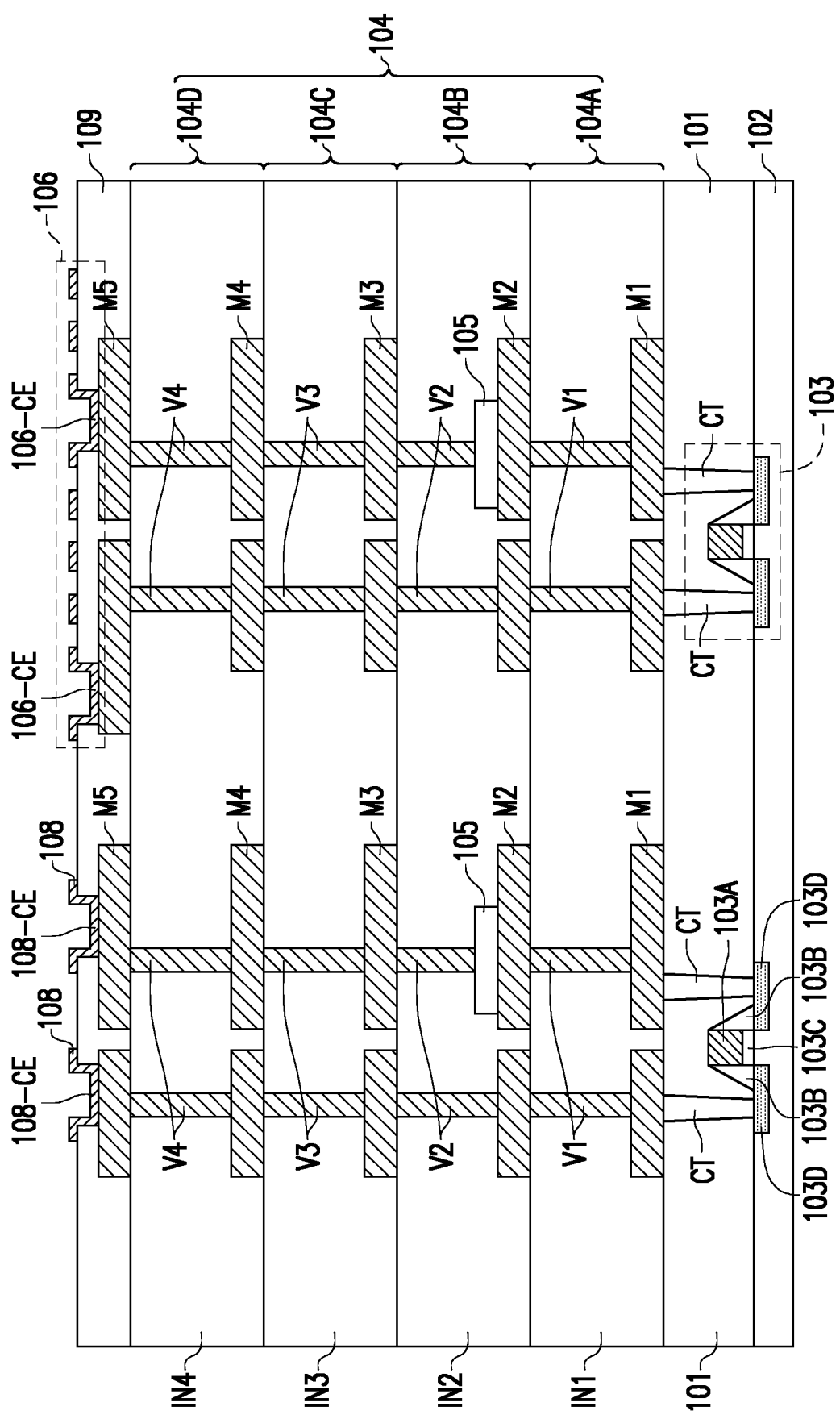

Referring to FIG. 3D, in a subsequent step, the conductive layer CL is patterned to form a plurality of conductive pads 108 and at least one inductor pattern 106. That is, the conductive pads 108 and the inductor pattern 106 may be formed by the same step, and may be located at a same level height on the passivation layer 109. In some embodiments, the conductive layer CL is patterned by providing a photoresist pattern (not shown) on the conductive layer CL. The photoresist pattern may be located in an area corresponding to the later-formed conductive pads 108 and inductor pattern 106. Thereafter, a suitable patterning process or etching process may be performed to remove portions of the conductive layer CL not covered by the photoresist, thereby forming the conductive pads 108 and the inductor pattern 106. In some embodiments, the formed conductive pads 108 is electrically connected to the metallization layer M5 of the interconnection layer 104 through a plurality of connecting elements 108-CE. Similarly, the inductor pattern 106 may be electrically connected to the metallization layer M5 of the interconnection layer 104 through a plurality of connecting elements 106-CE. The various designs of the inductor pattern 106 will be described in more detail at a later stage by referring to FIG. 6 to FIG. 15.

Figure 3E:
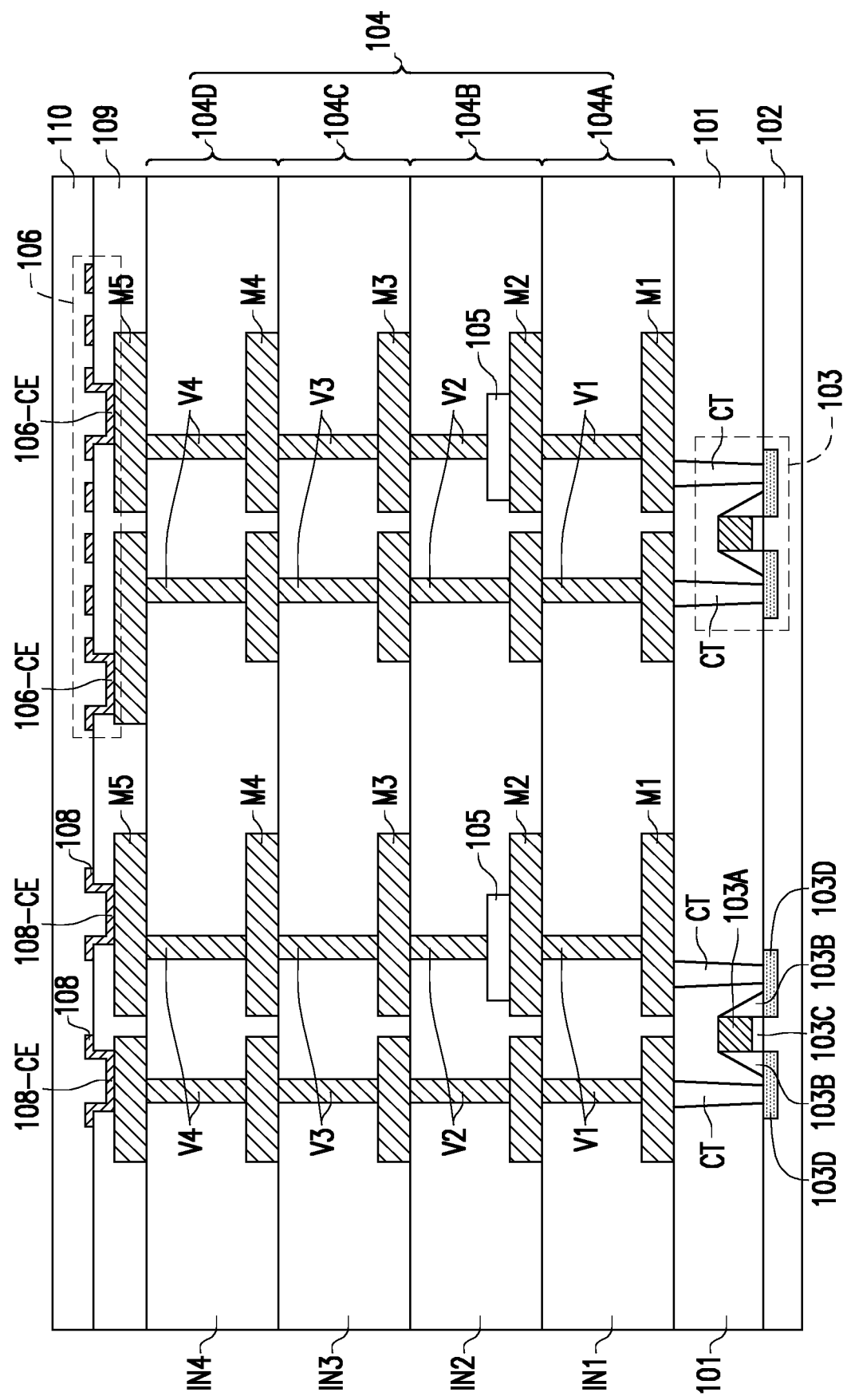

Referring to FIG. 3E, after forming the conductive pads 108 and the inductor pattern 106, a passivation layer 110 (a second passivation layer) is formed over the conductive pads 108 and the inductor pattern 106. In some embodiments, the passivation layer 110 is a silicon oxide layer, a silicon nitride layer, a silicon oxy-nitride layer or a dielectric layer formed of any suitable dielectric materials. In some embodiments, the passivation layer 110 may include an oxide layer and a silicon nitride layer stacked on the oxide layer. Furthermore, the passivation layer 110 may be formed by plasma enhanced chemical vapor deposition (PE-CVD), or the like. A material of the passivation layer 110 and a material of the passivation layer 109 may be the same or different.

Figure 3F:
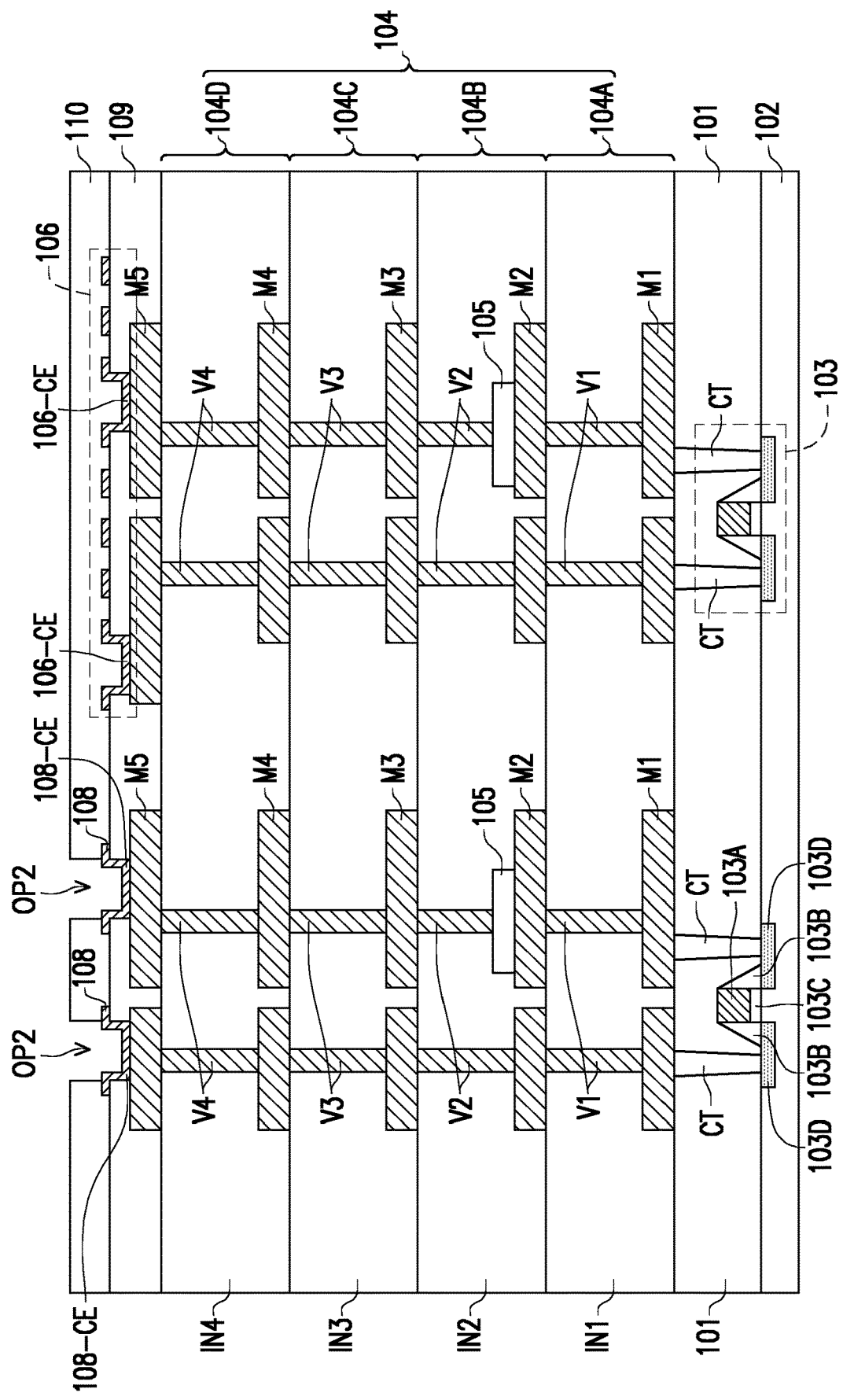

Referring to FIG. 3F, after forming the passivation layer 110, the passivation layer 110 is patterned to form a plurality of second openings OP2 revealing the plurality of conductive pads 108. For example, the patterning process is performed by providing a photoresist pattern (not shown) on the passivation layer 110. The photoresist pattern may cover up portions of the passivation layer 110, while revealing other portions of the passivation layer 110. Thereafter, portions of the passivation layer 110 not covered by the photoresist pattern may be etched to form the second openings OP2. In some embodiments, after patterning the passivation layer 110, a heating process (alloy process) is performed to heat the conductive pads 108 along with the passivation layers 109 and 110. For example, the heating process is performed after patterning the passivation layer 110 at a temperature range between 390° C. to 410° C.

Figure 3G:
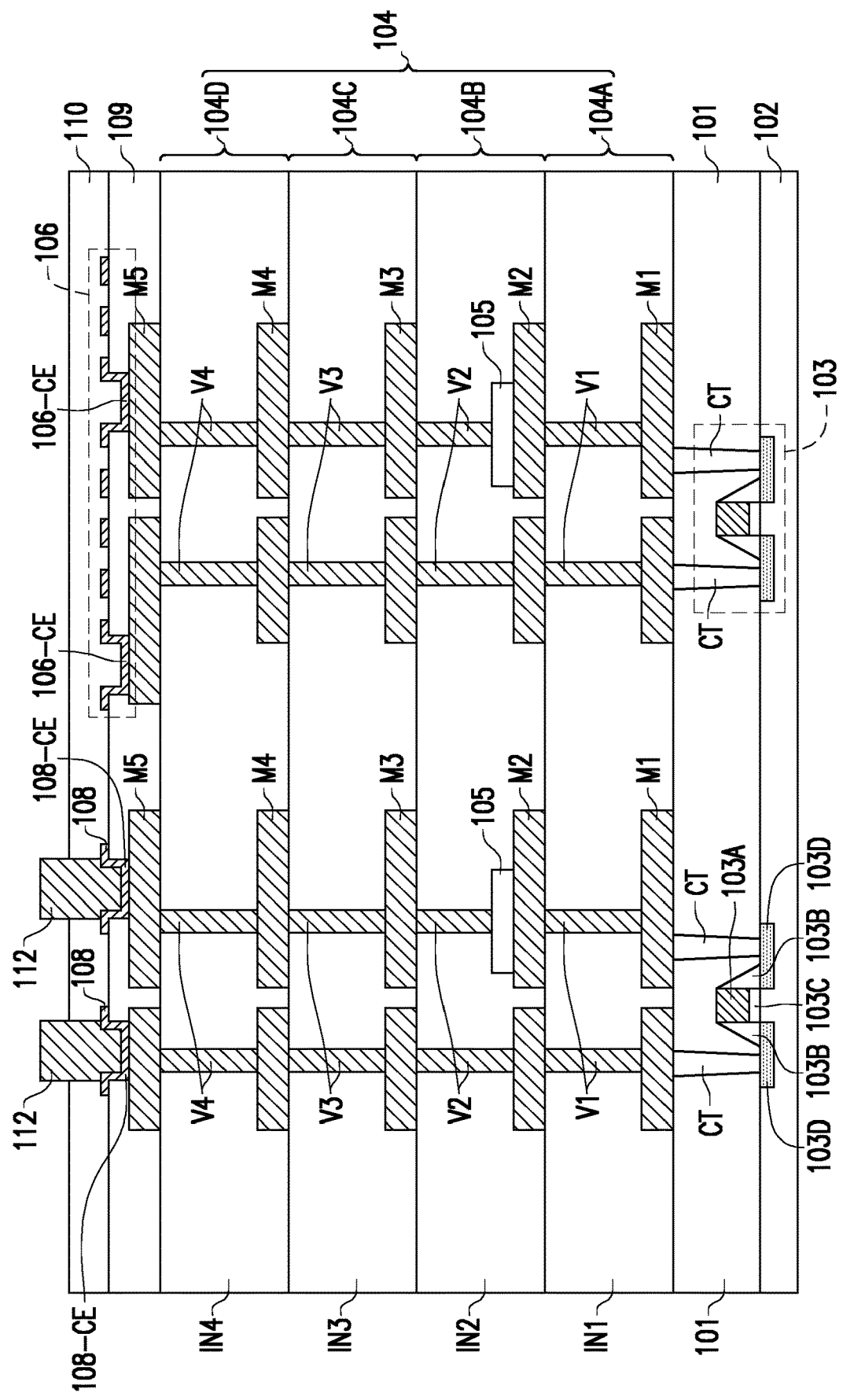

Thereafter, referring to FIG. 3G, a plurality of conductive posts 112 is formed in the plurality of second openings OP2 of the passivation layer 110. For example, the conductive posts 112 are electrically connected to the plurality of conductive pads 108 through the plurality of second openings OP2. In some embodiments, the conductive posts 112 are formed on the conductive pads 108 by plating. In some embodiments, the conductive posts 112 include conductive materials such as copper, or the like.

Figure 3H:
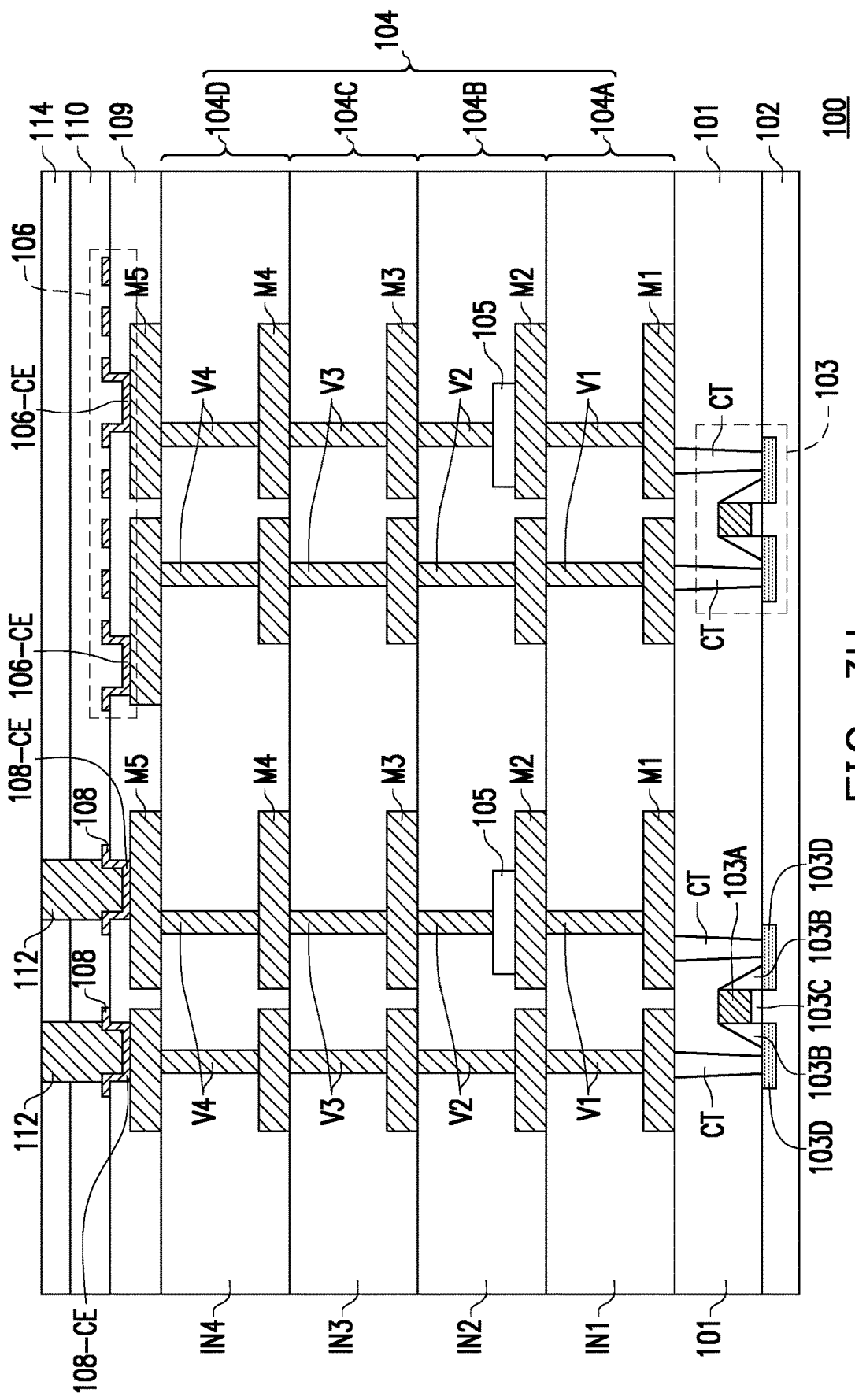

Referring to FIG. 3H, after forming the conductive posts 112, a protection layer 114 may be formed to surround the conductive posts 112. In some embodiments, the protection layer 114 may be formed to cover the conductive posts 112, and a planarization process (such as a chemical mechanical polishing (CMP) process) is performed to reveal the conductive posts 112 so that the semiconductor device 100 may be electrically connected to other components through the conductive posts 112. In some embodiments, when the substrate 102 is a wafer (e.g. silicon wafer) or part of a wafer, then the wafer may be diced to separate individual semiconductor devices 100 (one semiconductor device 100 illustrated in FIG. 3H) from one another. Up to here, a semiconductor device 100 according to some embodiments of the present disclosure may be accomplished.

Figure 4:
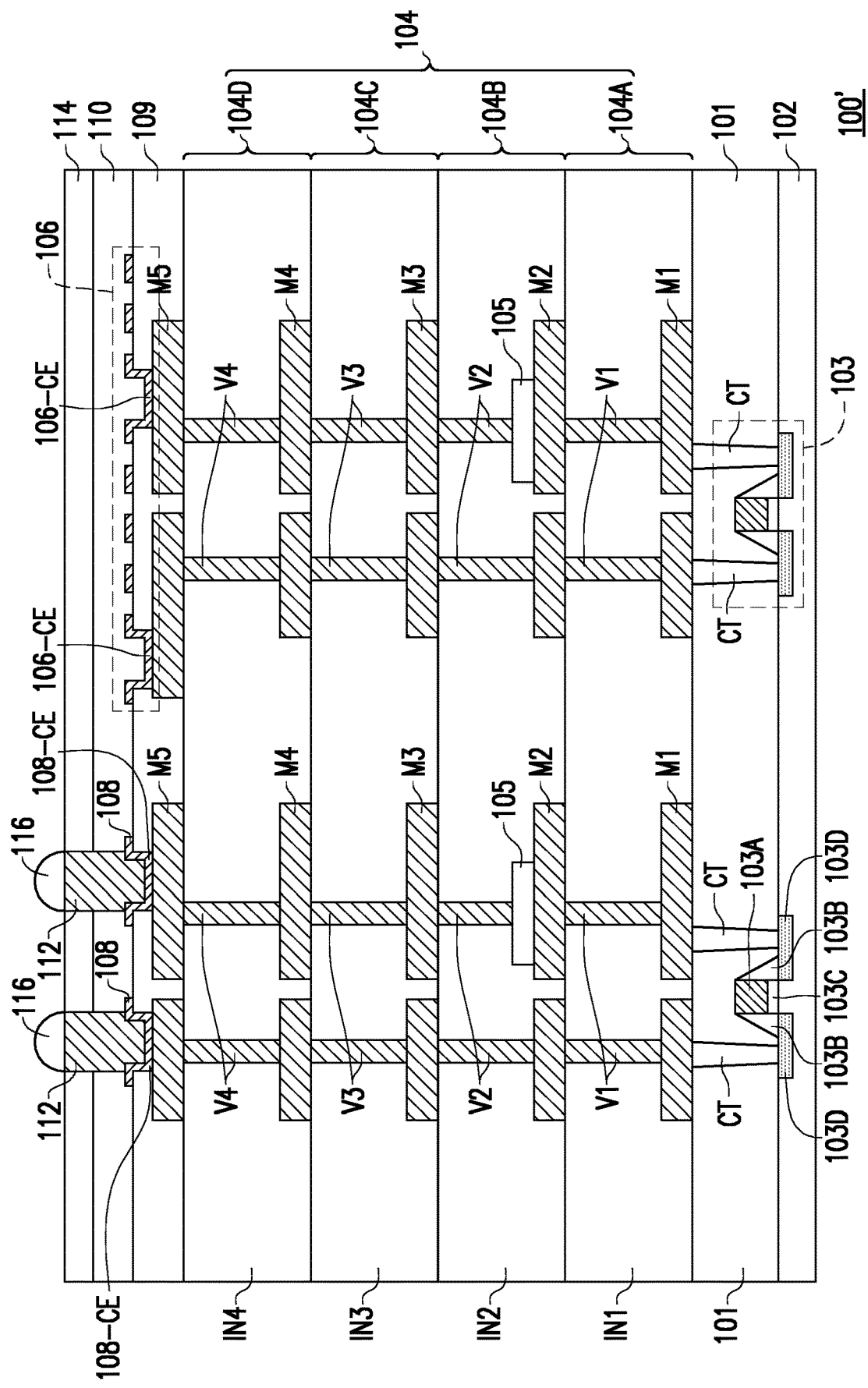
FIG. 4 is a schematic sectional view of a semiconductor device according to some exemplary embodiments of the present disclosure.

FIG. 4 is a schematic sectional view of a semiconductor device according to some exemplary embodiments of the present disclosure. The semiconductor device 100' illustrated in FIG. 4 is similar to the semiconductor device 100 illustrated in FIG. 3H. Therefore, the same reference numerals are used to refer to the same or like parts, and its detailed description will be omitted herein. The difference between the embodiments is that the semiconductor device 100' of FIG. 4 further comprises a plurality of conductive terminals 116. As shown in FIG. 4, the plurality of conductive terminals 116 is formed on and electrically connected to the conductive posts 112. In one embodiment, the conductive terminals 116 are micro-bumps, such as micro-bumps having copper metal pillars. In another embodiment, the conductive terminals 116 are solder bumps, lead-free solder bumps, or micro bumps, such as controlled collapse chip connection (C4) bumps or micro bumps containing copper pillars. In certain embodiments, the semiconductor device 100' is electrically connected to outside components through the conductive terminals 116.

Figure 5:
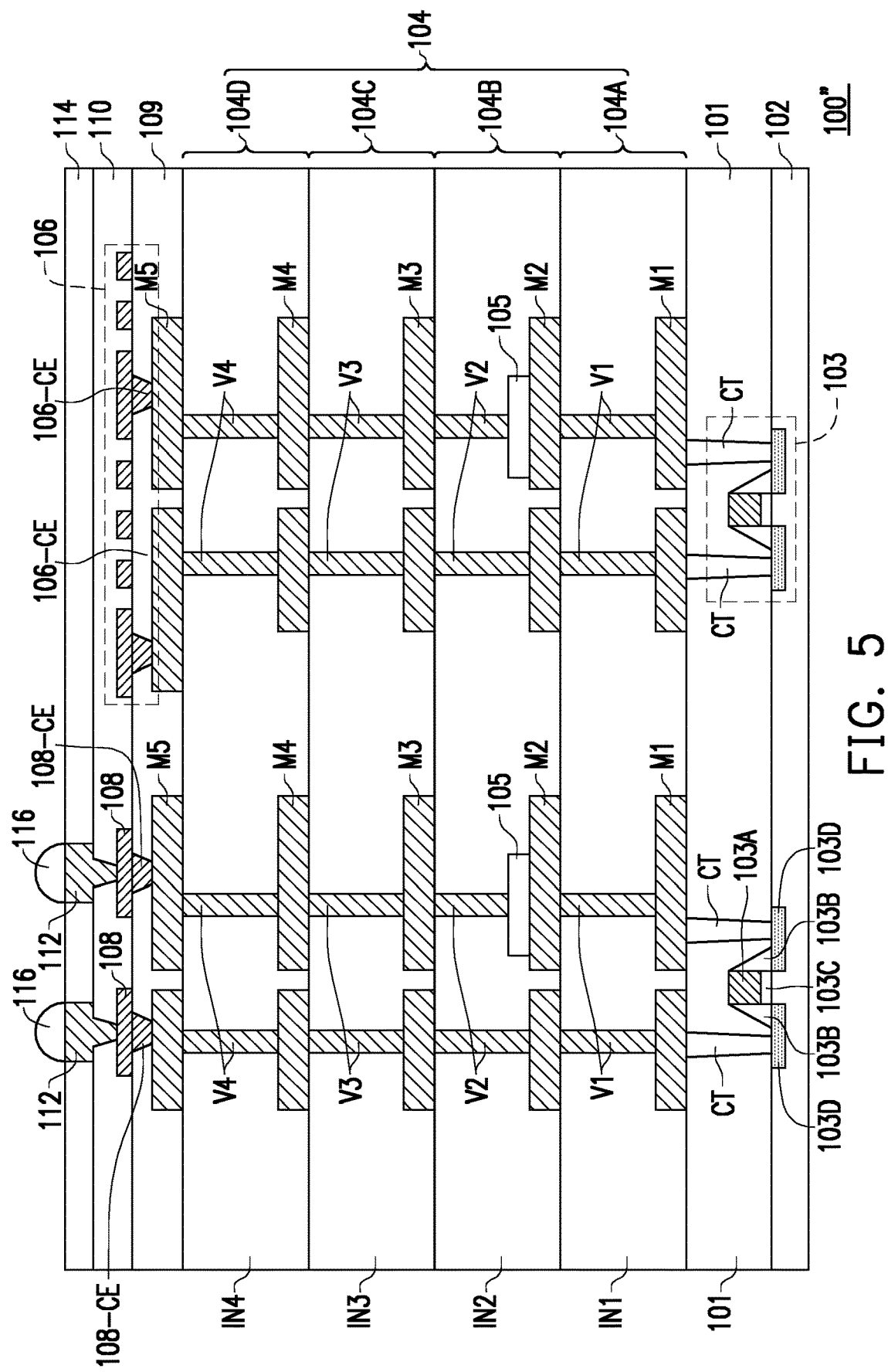
FIG. 5 is a schematic sectional view of a semiconductor device according to some exemplary embodiments of the present disclosure.

FIG. 5 is a schematic sectional view of a semiconductor device according to some exemplary embodiments of the present disclosure. The semiconductor device 100" illustrated in FIG. 5 is similar to the semiconductor device 100' illustrated in FIG. 4. Therefore, the same reference numerals are used to refer to the same or like parts, and its detailed description will be omitted herein. The difference between the embodiments is in the design/arrangement of the connecting elements 108-CE and the connecting elements 106-CE. In the previous embodiments, the connecting elements 108-CE are connected to the conductive pads 108, and the connecting elements 106-CE are connected to the inductor pattern 106 to form a U-Shaped pattern. In other words, the connecting elements 108-CE are conformally formed in the first openings OP1 and are formed along with the conductive pads 108 that is disposed over the passivation layer 109. Similarly, the connecting elements 106-CE are conformally formed in the first openings OP1 and are formed along with the inductor pattern 106 that is disposed over the passivation layer 109. However, the disclosure is not limited thereto. As illustrated in FIG. 5, in some embodiments, the connecting elements 106-CE and connecting elements 108-CE are formed as conductive vias that fill up the first openings. Furthermore, the conductive pads 108 are formed over top surfaces of the passivation layer 109 and the connecting elements 108-CE (conductive vias), while the inductor pattern is formed over top surfaces of the passivation layer 109 and the connecting elements 106-CE (conductive vias). In other words, the connecting elements 108-CE are joined with a bottom surface of the conductive pads 108, while the connecting elements 106-CE are joined with a bottom surface of the inductor pattern 106.

Besides the inductor pattern 106 illustrated in FIG. 2, the details of alternative designs of the inductor pattern 106 will be further described by referring to FIG. 6 to FIG. 15. It is noted that the various designs illustrated in FIG. 2 and FIG. 6 to FIG. 15 may be applied to the semiconductor devices 100, 100' and 100" described in FIG. 3H to FIG. 5. Furthermore, in case where two or more inductor patterns 106 exist in a single semiconductor device, it is noted that the inductor patterns 106 may include the same or different designs.

Figure 6:
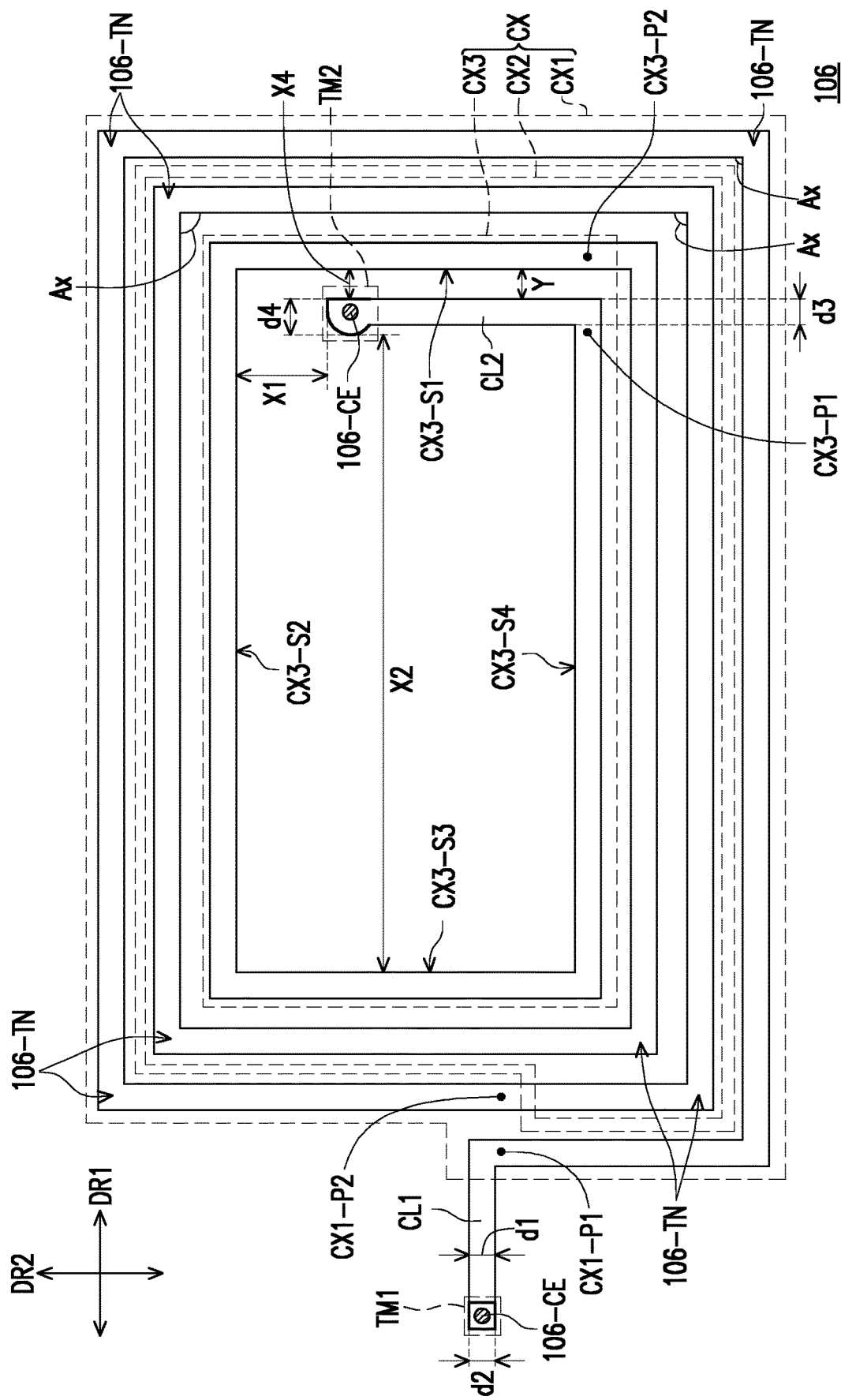
FIG. 6 is a top view of an inductor pattern according to some exemplary embodiments of the present disclosure.

FIG. 6 is a top view of an inductor pattern according to some exemplary embodiments of the present disclosure. The embodiment of FIG. 6 is similar to the embodiment of FIG. 2. Therefore, the same reference numerals are used to refer to the same or liked parts, and its detailed description will be omitted herein. In the embodiment of FIG. 2, the second terminal TM2 is designed to have a circular outline (from the top view), however, the disclosure is not limited thereto. For example, as illustrated in FIG. 6, the second terminal TM2 is designed to have a semi-circular outline (from the top view). In the illustrated embodiment, when the second terminal TM2 has a semi-circular outline, then the distance X4 of the second terminal TM2 spaced apart from the first side CX3-S1 of the inner coil CX3 is substantially equal to the distance Y of the second conductive line CL2 spaced apart from the first side CX3-S1 of the inner coil CX3. Similar to the previous embodiment, a relationship of the distance X1 to the distance Y satisfies: X1>1.25Y, and a relationship of the distance X2 to the distance Y satisfies: X2>1.25Y. Furthermore, the width d4 of the second terminal TM2 is designed to be greater than the width d3 of the second conductive line CL2. As such, an internal stress located in the inductor pattern 106 (inductor area) may be released, and a passivation crack issue may be resolved.

Figure 7:
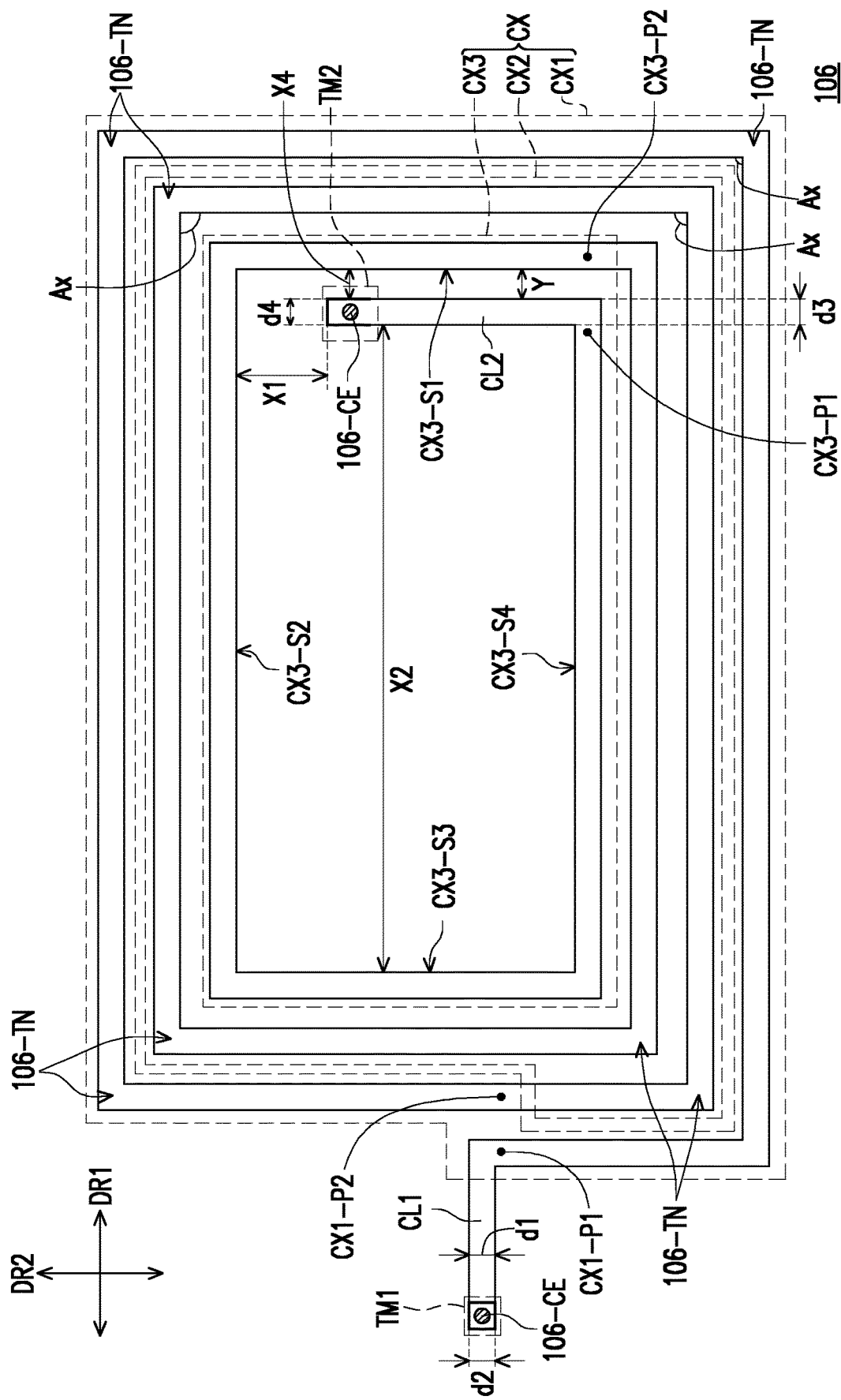
FIG. 7 is a top view of an inductor pattern according to some exemplary embodiments of the present disclosure.

FIG. 7 is a top view of an inductor pattern according to some exemplary embodiments of the present disclosure. The embodiment of FIG. 7 is similar to the embodiment of FIG. 2. Therefore, the same reference numerals are used to refer to the same or liked parts, and its detailed description will be omitted herein. The difference between the embodiments is that the second terminal TM2 of FIG. 7 has a width d4 that is substantially equal to the width d3 of the second conductive line CL2. In other words, a width/area of the second terminal TM2 is not enlarged. In such embodiment, a relationship of the distance X1 to the distance Y still satisfies: X1>1.25Y, and a relationship of the distance X2 to the distance Y still satisfies: X2>1.25Y. As such, an internal stress located in the inductor pattern 106 (inductor area) may be released, and a passivation crack issue may be resolved.

Figure 8:
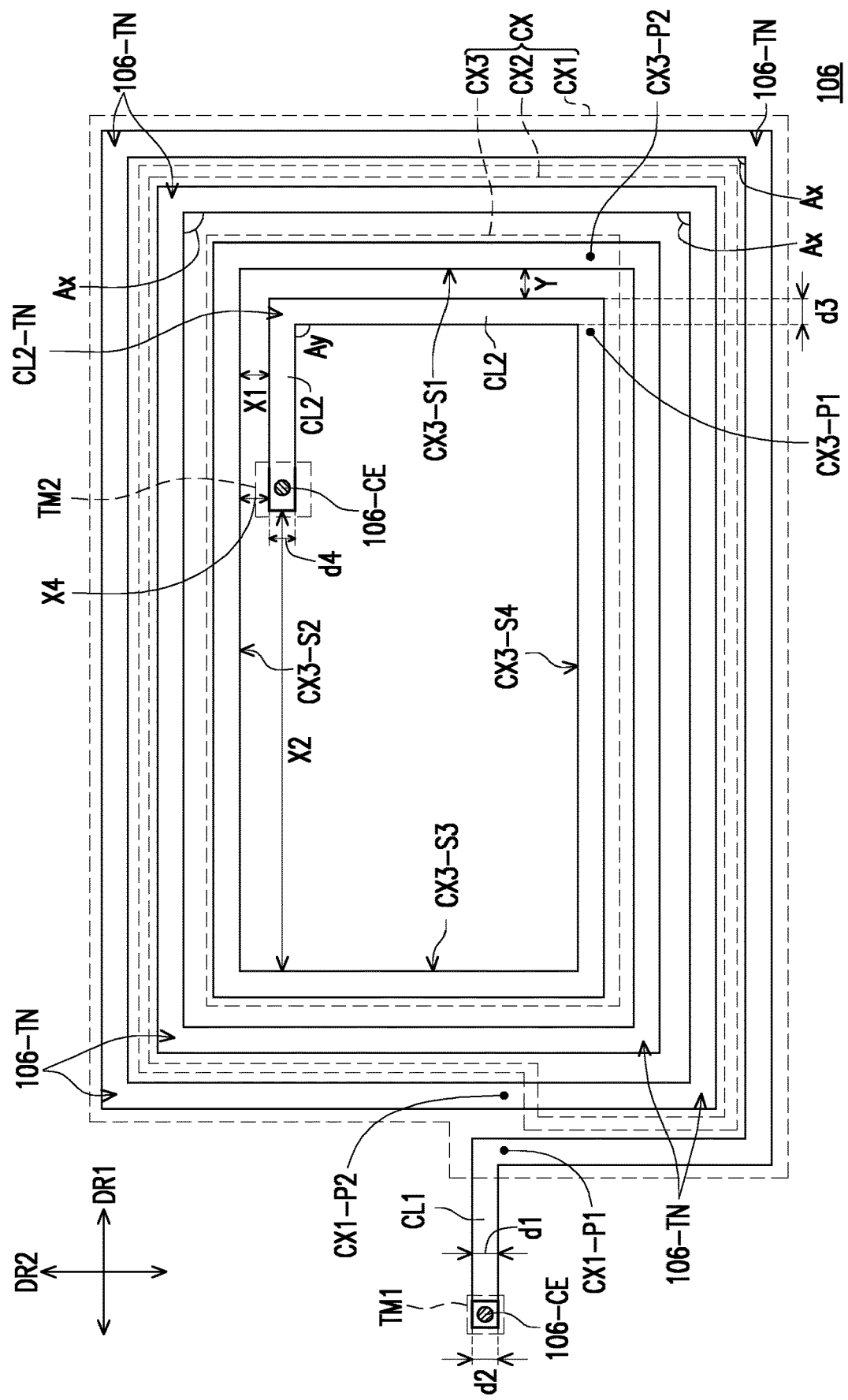
FIG. 8 is a top view of an inductor pattern according to some exemplary embodiments of the present disclosure.

FIG. 8 is a top view of an inductor pattern according to some exemplary embodiments of the present disclosure. The embodiment of FIG. 8 is similar to the embodiment of FIG. 2. Therefore, the same reference numerals are used to refer to the same or liked parts, and its detailed description will be omitted herein. The difference between the embodiments is that the second terminal TM2 of FIG. 8 has a width d4 that is substantially equal to the width d3 of the second conductive line CL2. Furthermore, the distance X1 of the second terminal TM2 spaced apart from the second side CX3-S2 of the inner coil CX3 is substantially equal to the distance Y of the second conductive line CL2 spaced apart from the first side CX3-S1 of the inner coil CX3. As illustrated in FIG. 8, in some embodiments, the second conductive line CL2 joined with the inner coil CX3 comprises two segments having a final coil turn CL2-TN, and an angle Ay of the final coil turn CL2-TN is 90 degrees. In such an embodiment, a relationship of the distance X2 to the distance Y still satisfies: X2>1.25Y. As such, an internal stress located in the inductor pattern 106 (inductor area) may be released, and a passivation crack issue may still be resolved.

Figure 9:
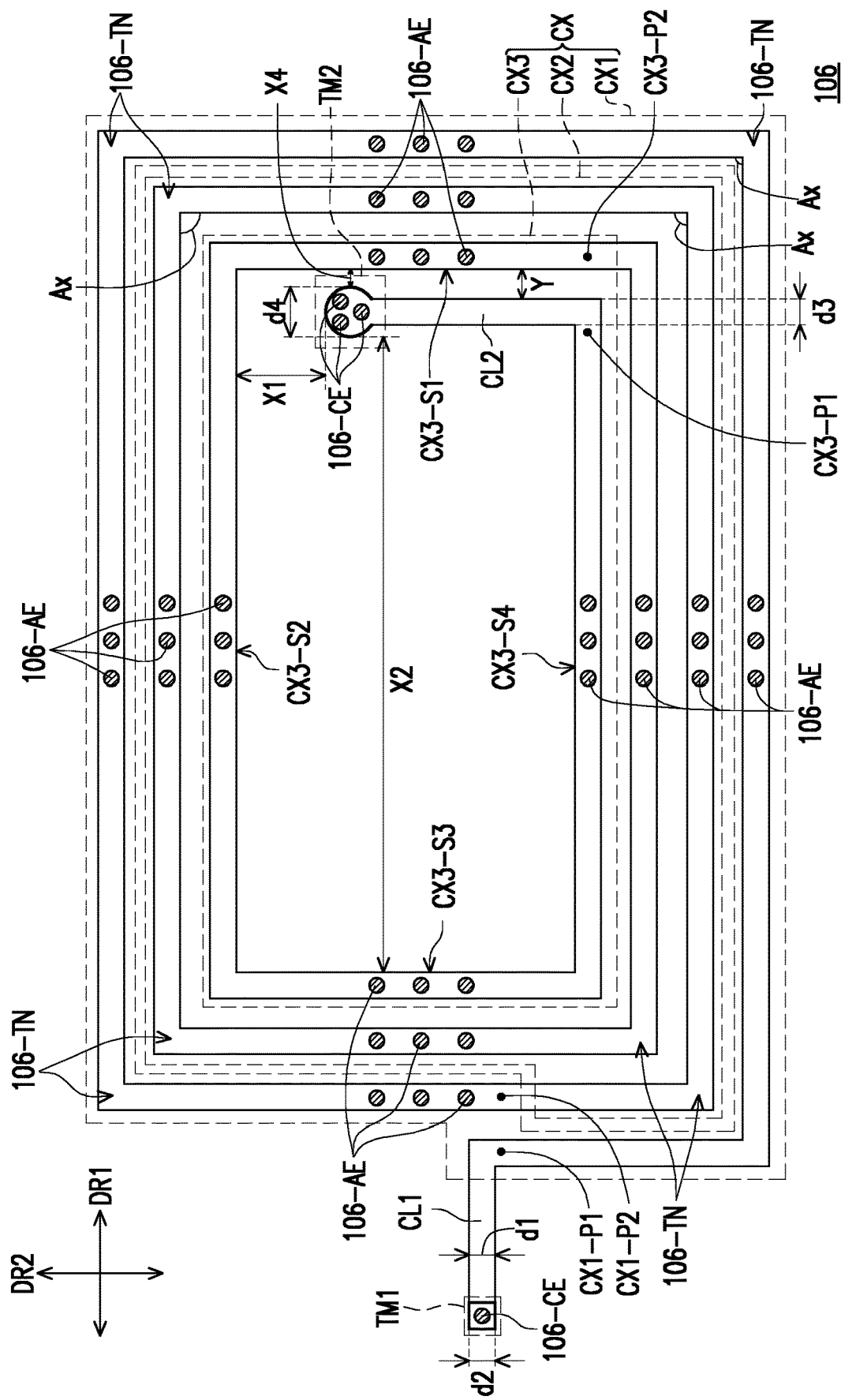
FIG. 9 is a top view of an inductor pattern according to some exemplary embodiments of the present disclosure.

FIG. 9 is a top view of an inductor pattern according to some exemplary embodiments of the present disclosure. The embodiment of FIG. 9 is similar to the embodiment of FIG. 2. Therefore, the same reference numerals are used to refer to the same or liked parts, and its detailed description will be omitted herein. In the embodiment of FIG. 2, the second terminal TM2 is electrically connected to the metallization layer M5 of the interconnection layer 104 through one connecting element 106-CE. However, the disclosure is not limited thereto. For example, as illustrated in FIG. 9, due to an increased width (or increased area) of the second terminal TM2, a plurality of connecting elements 106-CE are joined with a bottom surface of the second terminal TM2 to electrically connect the second terminal TM2 to the interconnection layer 104. For example, in the illustrated embodiment, three connecting elements 106-CE are joined with the bottom surface of the second terminal TM2 for providing electrical connection. It is noted that the number of connecting elements 106-CE joined with the bottom surface of the second terminal TM2 is not limited thereto. For example, there may be one connecting element 106-CE, or two or more connecting elements 106-CE joined with the second terminal TM2, which may be adjusted based on an area of the second terminal TM2. In some embodiments, by increasing the number of connecting elements 106-CE joined with the second terminal TM2, the amount of current flow is increased, while the inductance is enhanced.

As further illustrated in FIG. 9, a plurality of auxiliary connecting elements 106-AE is further disposed on the passivation layer 109 for electrically connecting the plurality of conductive coils CX to the interconnection layer 104 located underneath. For example, in some embodiments, each of the inner coil CX3, the intermediate coils CX2 and the outer coil CX1 comprises twelve auxiliary connecting elements 106-AE connected thereto, whereby three auxiliary connecting elements 106-AE are connected to each side of a single loop of the conductive coils CX. In some embodiments, the auxiliary connecting elements 106-AE connected to the outer coil CX1 may be substantially aligned with the auxiliary connecting elements 106-AE connected to the inner coil CX3 and the intermediate coils CX2. For example, the auxiliary connecting elements 106-AE connected to the conductive coils CX are aligned along the first direction DR1 and the second direction DR2. Furthermore, it is noted that the number and arrangement of the auxiliary connecting elements 106-AE connected to the conductive coils CX may be adjusted based on design requirements. In some embodiments, by including auxiliary connecting elements 106-AE connected to the conductive coils CX, the amount of current flow is further increased, while the inductance is further enhanced.

Figure 10:
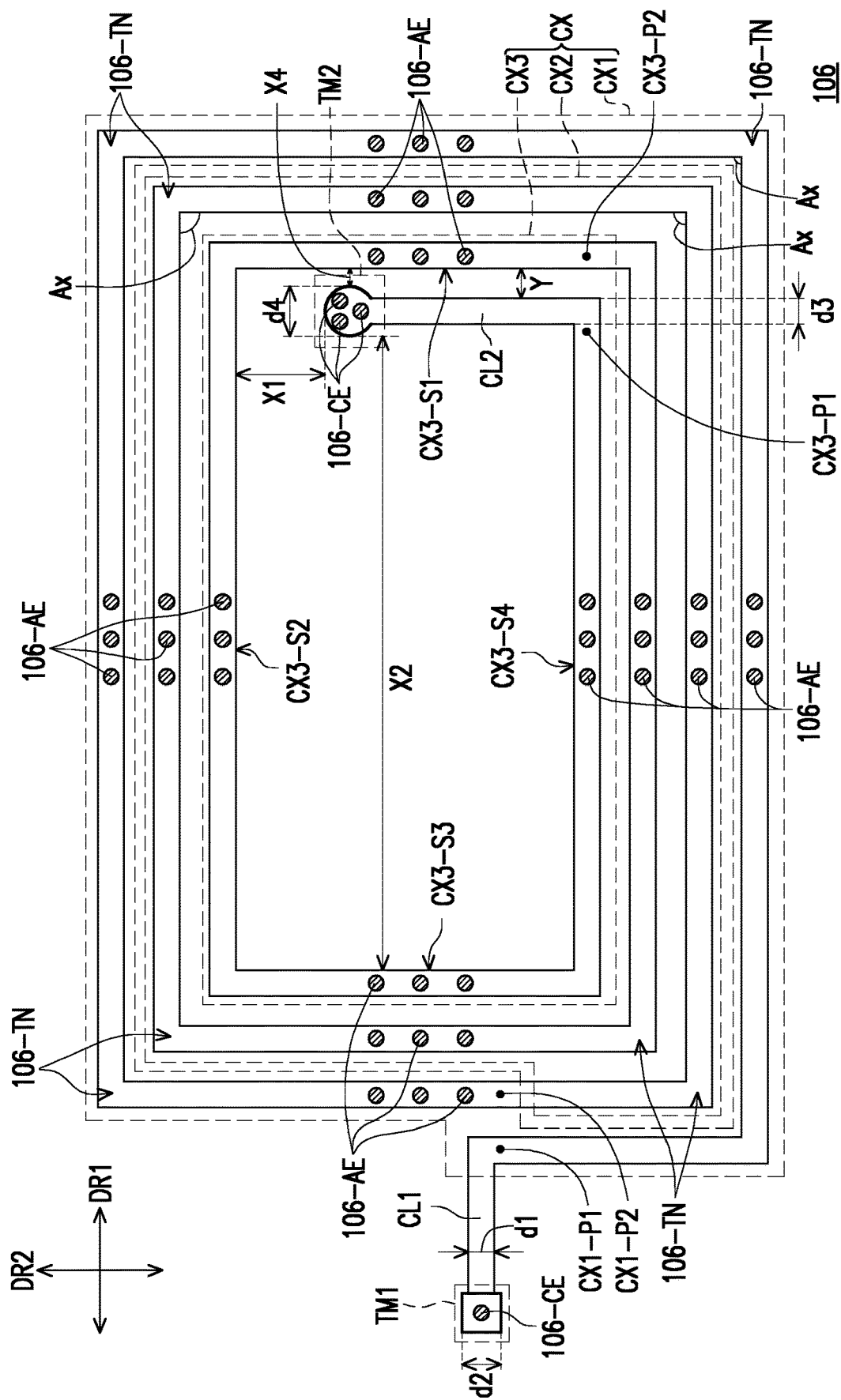
FIG. 10 is a top view of an inductor pattern according to some exemplary embodiments of the present disclosure.

FIG. 10 is a top view of an inductor pattern according to some exemplary embodiments of the present disclosure. The embodiment of FIG. 10 is similar to the embodiment of FIG. 2. Therefore, the same reference numerals are used to refer to the same or liked parts, and its detailed description will be omitted herein. The difference between the embodiments is in the width d2 of the first terminal TM1. As illustrated in FIG. 2, the width d2 of the first terminal TM1 is substantially equal to the width d1 of the first conductive line CL1 and the width d3 of the second conductive line CL2. However, the disclosure is not limited thereto. For example, as illustrated in FIG. 10, the width d2 of the first terminal TM1 is greater than the width d1 of the first conductive line CL1 and the width d3 of the second conductive line CL2. However, the width d4 of the second terminal TM2 is still greater than the widths d1, d2 and d3.

Similar to the previous embodiments, in the embodiment of FIG. 10, by increasing the width of the second terminal TM2 relative to the widths of the plurality of conductive coils CX, the first conductive line CL1 and the second conductive line CL2, an internal stress located in the inductor pattern 106 (inductor area) may be released, and a passivation crack issue may be resolved. Furthermore, by adjusting the second conductive line CL2 and the second terminal TM2 to satisfy the distance relationship above (X1>1.25Y; X2>1.25Y), the inner stress of the inductor pattern 106 may be further reduced, and a passivation crack issue may be prevented.

Figure 11:
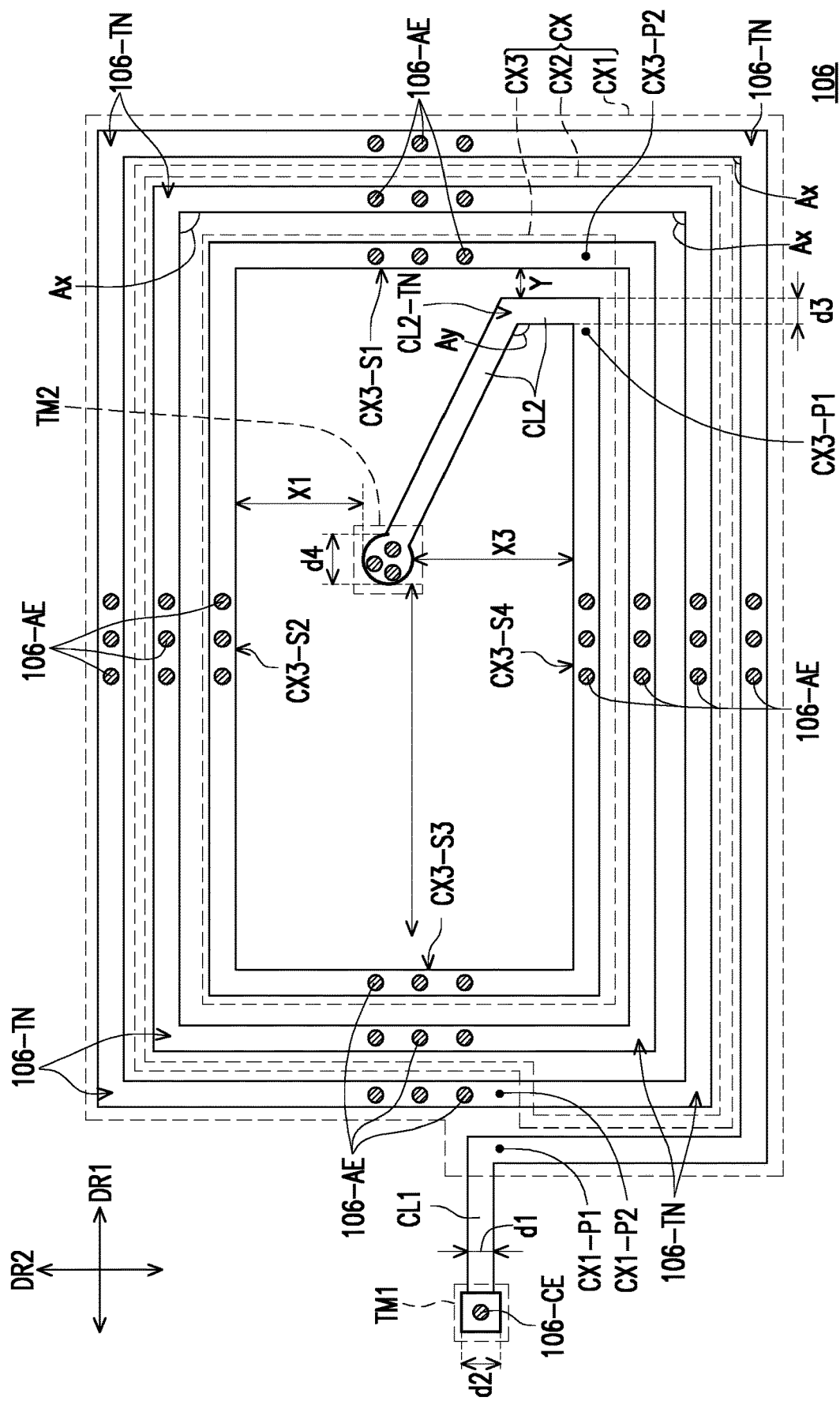
FIG. 11 is a top view of an inductor pattern according to some exemplary embodiments of the present disclosure.

FIG. 11 is a top view of an inductor pattern according to some exemplary embodiments of the present disclosure. The embodiment of FIG. 11 is similar to the embodiment of FIG. 10. Therefore, the same reference numerals are used to refer to the same or liked parts, and its detailed description will be omitted herein. The difference between the embodiments is in the arrangement of the second conductive line CL2 and the second terminal TM2. As illustrated in FIG. 11, the second conductive line CL2 joined with the inner coil CX3 comprises a final coil turn CL2-TN, and an angle Ay of the final coil turn CL2-TN is not 90 degrees. In the illustrated embodiment, the angle Ay of the final coil turn CL2-TN is greater than 90 degrees. However, in alternative embodiments, the angle Ay of the final coil turn CL2-TN is smaller than 90 degrees. As further illustrated in FIG. 11, the second terminal TM2 is arranged near a center region of the conductive coils CX. In such embodiment, the second terminal TM2 is spaced apart from the second side CX3-S2 of the inner coil CX3 in the second direction DR2 by distance X1, the second terminal TM2 is spaced apart from the third side CX3-S3 of the inner coil CX3 in the first direction DR1 by distance X2, and the second terminal TM2 is spaced apart from the fourth side CX3-S4 of the inner coil CX3 in the second direction DR2 by distance X3. In the exemplary embodiment, a relationship of the distance X1 to the distance Y satisfies: X1>1.25Y, a relationship of the distance X2 to the distance Y satisfies: X2>1.25Y, and a relationship of the distance X3 satisfies: X3>1.25Y.

Similar to the previous embodiments, in the embodiment of FIG. 11, by increasing the width of the second terminal TM2 relative to the widths of the plurality of conductive coils CX, the first conductive line CL1 and the second conductive line CL2, an internal stress located in the inductor pattern 106 (inductor area) may be released, and a passivation crack issue may be resolved. Furthermore, by adjusting the second conductive line CL2 and the second terminal TM2 to satisfy the distance relationship above (X1>1.25Y; X2>1.25Y; X3>1.25Y), the inner stress of the inductor pattern 106 may be further reduced, and a passivation crack issue may be prevented.

Figure 12:
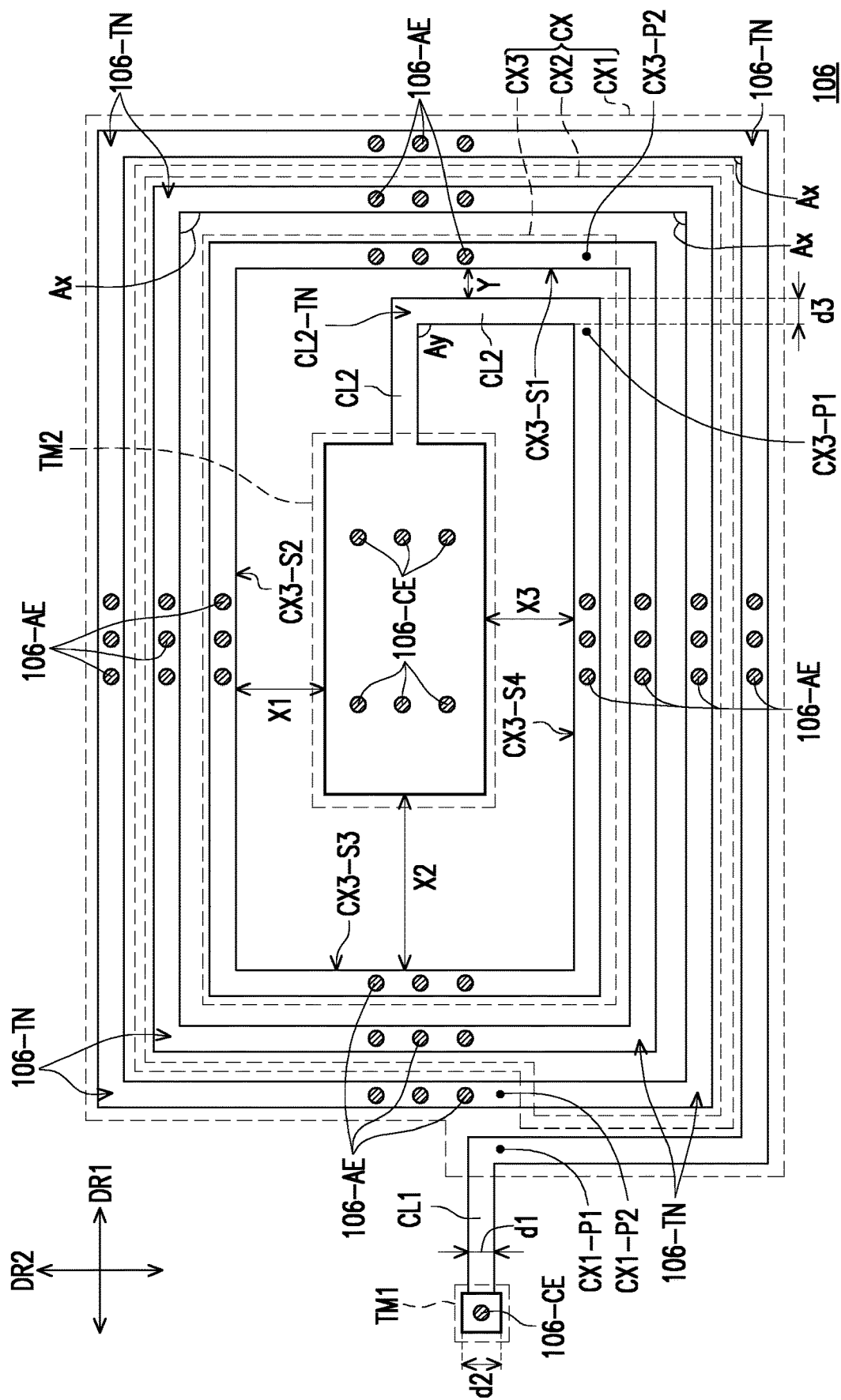
FIG. 12 is a top view of an inductor pattern according to some exemplary embodiments of the present disclosure.

FIG. 12 is a top view of an inductor pattern according to some exemplary embodiments of the present disclosure. The embodiment of FIG. 12 is similar to the embodiment of FIG. 11. Therefore, the same reference numerals are used to refer to the same or liked parts, and its detailed description will be omitted herein. The difference between the embodiments is in the arrangement and design of the second conductive line CL2 and the second terminal TM2. As illustrated in FIG. 12, the second conductive line CL2 joined with the inner coil CX3 comprises a final coil turn CL2-TN, and an angle Ay of the final coil turn CL2-TN is 90 degrees. Furthermore, in the previous embodiment, the second terminal TM2 is designed to have a circular outline (from the top view). However, as illustrated in FIG. 12, the second terminal TM2 is designed to have a rectangular outline. In some embodiments, the dimensions and width of the second terminal TM2 may be increased as long as they satisfy the distance relationship described above (X1>1.25Y; X2>1.25Y; X3>1.25Y). Furthermore, the number of connecting elements 106-CE joined to the second terminal TM2 may be increased, due to an increased area of the second terminal TM2.

Similar to the previous embodiments, in the embodiment of FIG. 12, by increasing the width of the second terminal TM2 relative to the widths of the plurality of conductive coils CX, the first conductive line CL1 and the second conductive line CL2, an internal stress located in the inductor pattern 106 (inductor area) may be released, and a passivation crack issue may be resolved. Furthermore, by adjusting the second conductive line CL2 and the second terminal TM2 to satisfy the distance relationship above (X1>1.25Y; X2>1.25Y; X3>1.25Y), the inner stress of the inductor pattern 106 may be further reduced, and a passivation crack issue may be prevented.

Figure 13:
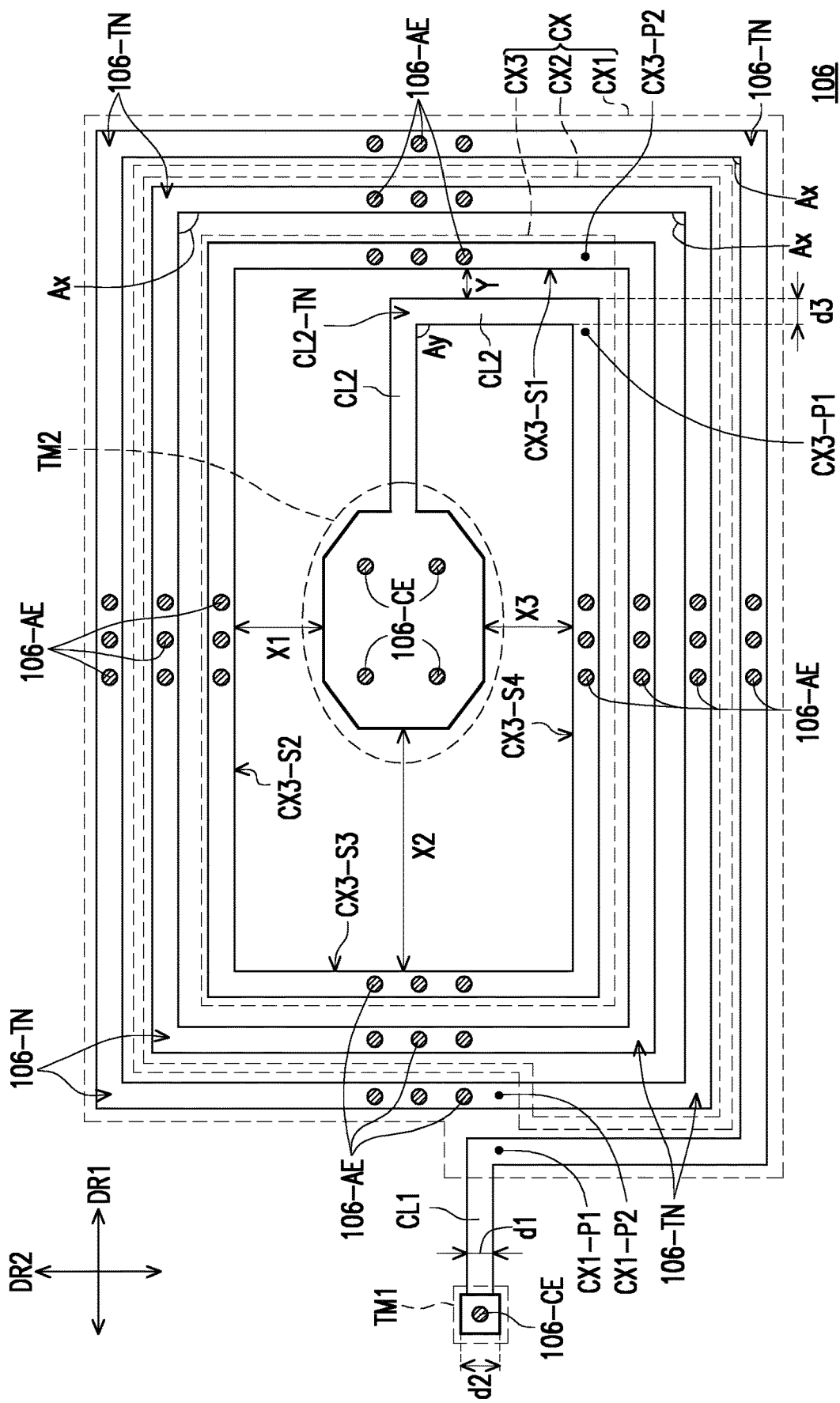
FIG. 13 is a top view of an inductor pattern according to some exemplary embodiments of the present disclosure.

FIG. 13 is a top view of an inductor pattern according to some exemplary embodiments of the present disclosure. The embodiment of FIG. 13 is similar to the embodiment of FIG. 11. Therefore, the same reference numerals are used to refer to the same or liked parts, and its detailed description will be omitted herein. The difference between the embodiments is in the arrangement and design of the second conductive line CL2 and the second terminal TM2. As illustrated in FIG. 13, the second conductive line CL2 joined with the inner coil CX3 comprises a final coil turn CL2-TN, and an angle Ay of the final coil turn CL2-TN is 90 degrees. Furthermore, in the previous embodiment, the second terminal TM2 is designed to have a circular outline (from the top view). However, as illustrated in FIG. 10, the second terminal TM2 is designed to have an octagonal shaped outline. In such embodiment, the first side TM2-S1 of the second terminal TM2 is spaced apart from the second side CX3-S2 of the inner coil CX3 in the second direction DR2 by distance X1, the second side TM2-S2 of the second terminal TM2 is spaced apart from the third side CX3-S3 of the inner coil CX3 in the first direction DR1 by distance X2, and the third side TM2-S3 of the second terminal TM2 is spaced apart from the fourth side CX3-S4 of the inner coil CX3 in the second direction DR2 by distance X3. From the above embodiments, it is noted that the shape or design of the second terminal TM2 may be appropriately adjusted (e.g. into a circle, square, rectangle, polygonal, etc.) as long as they satisfy the distance relationship described above (X1>1.25Y; X2>1.25Y; X3>1.25Y).

Similar to the previous embodiments, in the embodiment of FIG. 13, by increasing the width of the second terminal TM2 relative to the widths of the plurality of conductive coils CX, the first conductive line CL1 and the second conductive line CL2, an internal stress located in the inductor pattern 106 (inductor area) may be released, and a passivation crack issue may be resolved. Furthermore, by adjusting the second conductive line CL2 and the second terminal TM2 to satisfy the distance relationship above (X1>1.25Y; X2>1.25Y; X3>1.25Y), the inner stress of the inductor pattern 106 may be further reduced, and a passivation crack issue may be prevented.

Figure 14:
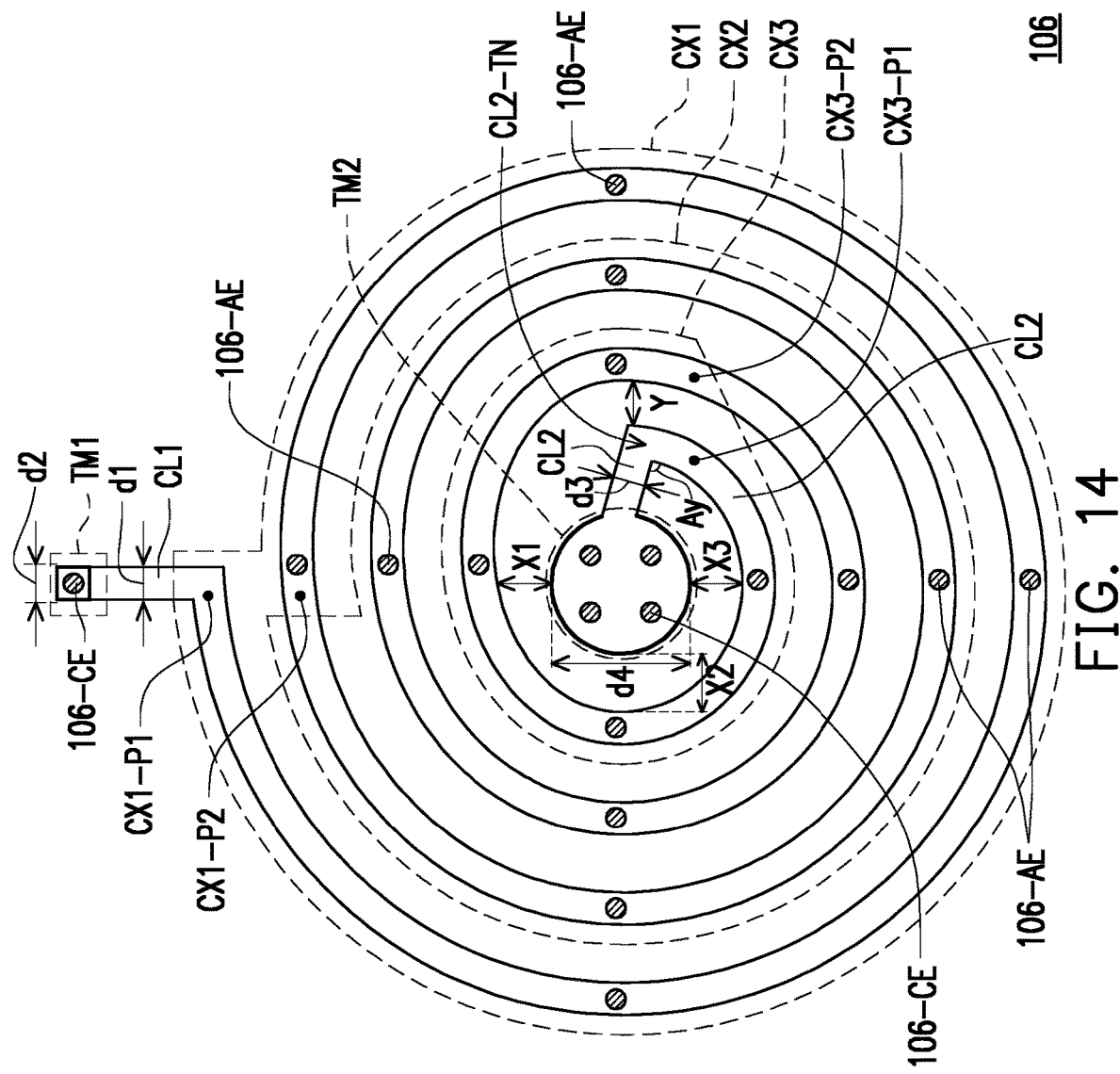
FIG. 14 is a top view of an inductor pattern according to some exemplary embodiments of the present disclosure.

FIG. 14 is a top view of an inductor pattern according to some exemplary embodiments of the present disclosure. The embodiment of FIG. 14 is similar to the embodiment of FIG. 11. Therefore, the same reference numerals are used to refer to the same or liked parts, and its detailed description will be omitted herein. The difference between the embodiments is in the design and arrangement of the conductive coils CX. As illustrated in the previous embodiments, the conductive coils CX are coiled up in a rectangular fashion. However, the disclosure is not limited thereto. Referring to FIG. 14, the conductive coils CX are arranged in a circular fashion. Similar to the previous embodiments, the conductive coils CX have an outer coil CX1, an inner coil CX3 and intermediate coils CX2 defined in a similar way. Furthermore, as illustrated in FIG. 14, the second conductive line CL2 joined with the inner coil CX3 comprises a final coil turn CL2-TN, and an angle Ay of the final coil turn CL2-TN is equal to or smaller than 90 degrees. In some embodiments, the second conductive line CL2 is spaced apart from a first side (e.g. right side from top view) by distance Y, the second terminal TM2 is spaced apart from a second side (e.g. upper side from top view) of the inner coil CX3 in the second direction DR2 by distance X1, the second terminal TM2 is spaced apart from the third side (e.g. left side from top view) of the inner coil CX3 in the first direction DR1 by distance X2, and the second terminal TM2 is spaced apart from the fourth side (e.g. lower side from top view) of the inner coil CX3 in the second direction DR2 by distance X3.

In a similar way, in the embodiment of FIG. 14, by increasing the width of the second terminal TM2 relative to the widths of the plurality of conductive coils CX, the first conductive line CL1 and the second conductive line CL2, an internal stress located in the inductor pattern 106 (inductor area) may be released, and a passivation crack issue may be resolved. Furthermore, by adjusting the second conductive line CL2 and the second terminal TM2 to satisfy the distance relationship above (X1>1.25Y; X2>1.25Y; X3>1.25Y), the inner stress of the inductor pattern 106 may be further reduced, and a passivation crack issue may be prevented.

Figure 15:
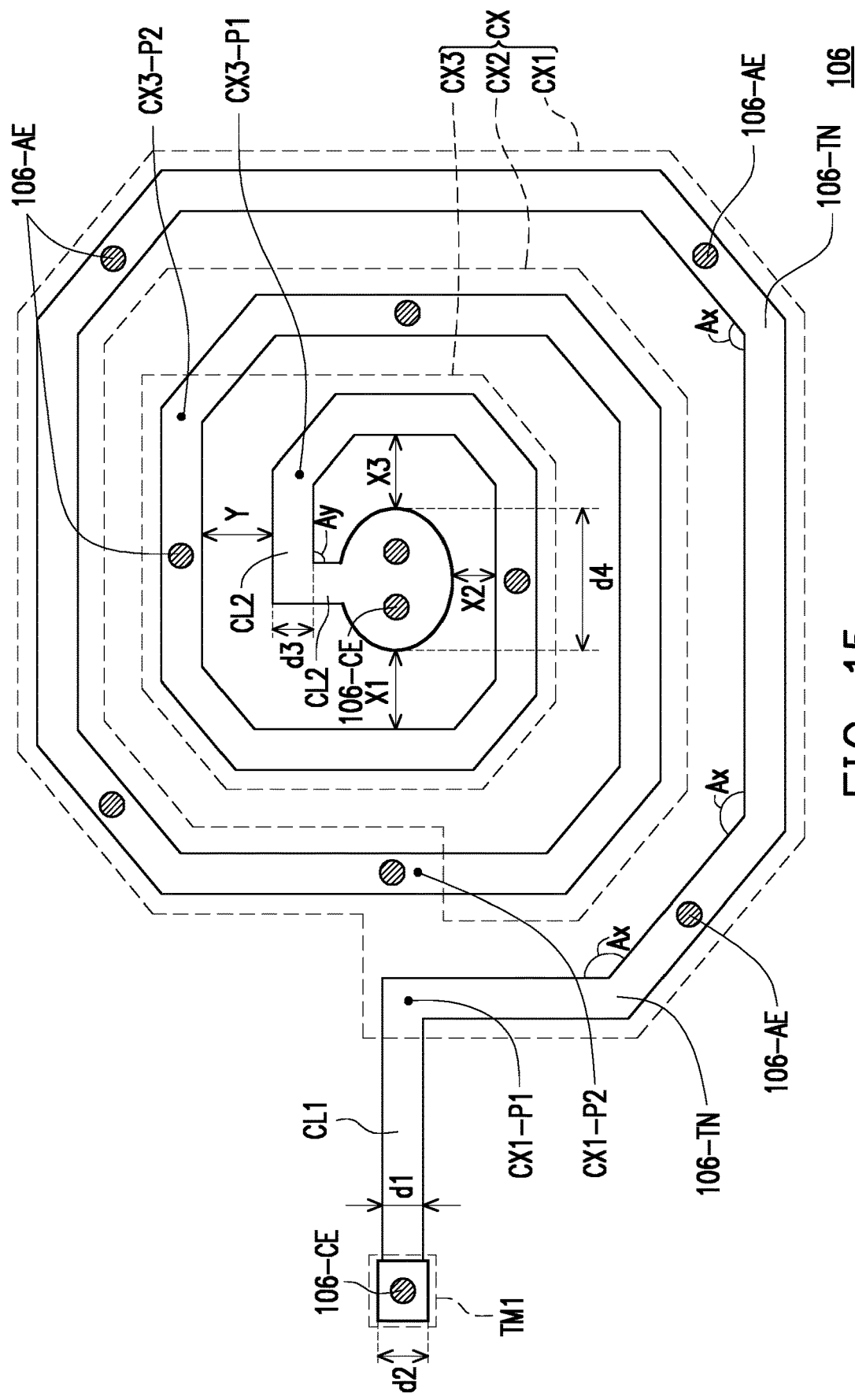
FIG. 15 is a top view of an inductor pattern according to some exemplary embodiments of the present disclosure.

FIG. 15 is a top view of an inductor pattern according to some exemplary embodiments of the present disclosure. The embodiment of FIG. 15 is similar to the embodiment of FIG. 11. Therefore, the same reference numerals are used to refer to the same or liked parts, and its detailed description will be omitted herein. The difference between the embodiments is in the design and arrangement of the conductive coils CX. As illustrated in the previous embodiments, the conductive coils CX are coiled up in a rectangular fashion, wherein each of the plurality of coil turns 106-TN of the conductive coils CX has an angle Ax of 90 degrees. However, the disclosure is not limited thereto. Referring to FIG. 15, the conductive coils CX are coiled up in a polygonal fashion, whereby each of the plurality of coil turns 106-TN of the conductive coils CX has an angle Ax of greater than 90 degrees.

Similar to the previous embodiments, in the embodiment of FIG. 15, by increasing the width of the second terminal TM2 relative to the widths of the plurality of conductive coils CX, the first conductive line CL1 and the second conductive line CL2, an internal stress located in the inductor pattern 106 (inductor area) may be released, and a passivation crack issue may be resolved. Furthermore, by adjusting the second conductive line CL2 and the second terminal TM2 to satisfy the distance relationship above (X1>1.25Y; X2>1.25Y; X3>1.25Y), the inner stress of the inductor pattern 106 may be further reduced, and a passivation crack issue may be prevented.

In the above-mentioned embodiments, the semiconductor device (or semiconductor die) includes at least one inductor pattern whereby the second terminal width is increased, and/or the second terminal and the second conductive line satisfy a certain distance relationship (X1>1.25Y; X2>1.25Y; X3>1.25Y). As such, the inner stress of the inductor pattern may be reduced, while any internal stress remaining in the inductor pattern may be released through the second terminal having an enlarged width/area. Overall, a high internal stress located in the inductor area may be prevented, and a passivation crack issue may be resolved.

In accordance with some embodiments of the present disclosure, a semiconductor device includes a semiconductor substrate, an interconnection layer and an inductor pattern. The interconnection layer is disposed on the semiconductor substrate. The inductor pattern is disposed on and electrically connected to the interconnection layer. The inductor pattern includes a first conductive line, a second conductive line and a plurality of conductive coils. The first conductive line is joined with a first terminal. The second conductive line is joined with a second terminal. The plurality of conductive coils is joining the first conductive line to the second conductive line, wherein the plurality of conductive coils includes an outer coil joined with the first conductive line, an inner coil joined with the second conductive line and the outer coil, and wherein the second conductive line is spaced apart from a first side of the inner coil in a first direction by distance Y, the distance Y is equal to a spacing of loops of the plurality of conductive coils, the second terminal is spaced apart from a second side of the inner coil in a second direction by distance X1, and a relationship of the distance X1 to the distance Y satisfies: X1>1.25Y, and the second direction is perpendicular to the first direction.

In accordance with some other embodiments of the present disclosure, a semiconductor device includes a semiconductor substrate, an interconnection layer, a first passivation layer, a plurality of conductive pads, at least one inductor pattern, a second passivation layer and a plurality of conductive posts. The interconnection layer is disposed on the semiconductor substrate. The first passivation layer is disposed on the interconnection layer. The plurality of conductive pads is disposed on the first passivation layer and electrically connected to the interconnection layer. The inductor pattern is electrically connected to the interconnection layer, and includes a first terminal, a first conductive line, a second terminal, a second conductive line and a plurality of conductive coils. The first terminal is disposed on the first passivation layer and electrically connected to the interconnection layer. The first conductive line is joined with the first terminal, wherein a width of the first conductive line is d1 and a width of the first terminal is d2. The second terminal is disposed on the first passivation layer and electrically connected to the interconnection layer. The second conductive line is joined with the second terminal, wherein a width of the second conductive line is d3 and a width of the second terminal is d4, and the width d4 is greater than the widths d1, d2 and d3. The plurality of conductive coils is disposed on the first passivation layer and joining the first conductive line to the second conductive line. The second passivation layer is disposed on the plurality of conductive pads and the at least one inductor pattern. The plurality of conductive posts is disposed on the second passivation layer and electrically connected to the plurality of conductive pads.

In accordance with yet another embodiment of the present disclosure, a method of fabricating a semiconductor device is described. The method includes the following steps. A semiconductor substrate is provided. An interconnection layer is formed on the semiconductor substrate. A first passivation layer is formed on the interconnection layer, and the first passivation layer is patterned to form a plurality of first openings. A conductive layer is formed on the first passivation layer, wherein the conductive layer is electrically connected to the interconnection layer through the plurality of first openings. The conductive layer is patterned to form a plurality of conductive pads and at least one inductor pattern, wherein the at least one inductor pattern includes a first conductive line, a second conductive line and a plurality of conductive coils. The first conductive line is joined with a first terminal. The second conductive is joined with a second terminal. The plurality of conductive coils is joining the first conductive line to the second conductive line. The plurality of conductive coils include an outer coil joined with the first conductive line, an inner coil joined with the second conductive line and the outer coil, and wherein the second conductive line is spaced apart from a first side of the inner coil in a first direction by distance Y, the distance Y is equal to a spacing of loops of the plurality of conductive coils, the second terminal is spaced apart from a second side of the inner coil in a second direction by distance X1, and a relationship of the distance X1 to the distance Y satisfies: X1>1.25Y, and the second direction is perpendicular to the first direction. A second passivation layer is formed on the plurality of conductive pads and the at least one inductor pattern, and the second passivation layer is patterned to form a plurality of second openings revealing the plurality of conductive pads. A plurality of conductive posts is formed in the plurality of second openings, wherein the plurality of conductive posts is electrically connected to the plurality of conductive pads through the plurality of second openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
   a semiconductor substrate;
   an interconnection layer disposed on the semiconductor substrate;
   an inductor pattern disposed on and electrically connected to the interconnection layer, wherein the inductor pattern comprises:
      a first conductive line joined with a first terminal;
      a second conductive line joined with a second terminal; and
      a plurality of conductive coils joining the first conductive line to the second conductive line, wherein the plurality of conductive coils comprises an outer coil joined with the first conductive line, an inner coil joined with the second conductive line and the outer coil, and wherein the second conductive line is spaced apart from a first side of the inner coil in a first direction by distance Y, the distance Y is equal to a spacing of loops of the plurality of conductive coils, the second terminal is spaced apart from a second side of the inner coil in a second direction by distance X1, and a relationship of the distance X1 to the distance Y satisfies: X1>1.25Y;
   a plurality of auxiliary connecting elements electrically connecting the plurality of conductive coils to the interconnection layer, wherein the plurality of auxiliary connecting elements comprises a first portion of auxiliary connecting elements connected to the outer coil and a second portion of auxiliary connecting elements connected to the inner coil, and a number of the first portion of auxiliary connecting elements is equal to a number of the second portion of auxiliary connecting elements.

2. The semiconductor device according to claim 1, wherein the first terminal and the second terminal is electrically connected to the interconnection layer through a plurality of connecting elements.

3. The semiconductor device according to claim 2, wherein the second terminal is electrically connected to the interconnection layer through two or more of the plurality of connecting elements that are joined with a bottom surface of the second terminal.

4. The semiconductor device according to claim 1, wherein a width of the second terminal is greater than a width of the second conductive line.

5. The semiconductor device according to claim 1, wherein the second terminal is spaced apart from a third side of the inner coil in the first direction by distance X2, and the third side of the inner coil faces the first side of the inner coil, and a relationship of the distance X2 to the distance Y satisfies: X2>1.25Y.

6. The semiconductor device according to claim 1, wherein the plurality of conductive coils comprises a plurality of coil turns, and each of the plurality of coil turns has an angle of 90 degrees.

7. The semiconductor device according to claim 6, wherein the second conductive line joined with the inner coil comprises a final coil turn, and an angle of the final coil turn is not 90 degrees.

8. The semiconductor device according to claim 1, wherein the plurality of conductive coils is arranged in a circular fashion.

9. The semiconductor device according to claim 1, wherein the first portion of auxiliary connecting elements on the outer coil and the second portion of auxiliary connecting elements on the inner coil are aligned with one another along the first direction and the second direction.

10. The semiconductor device according to claim 1, wherein the first portion of auxiliary connecting elements comprises twelve auxiliary connecting elements, whereby three auxiliary connecting elements are connected to each side of the outer coil.

11. A semiconductor device, comprising:
a semiconductor substrate;
an interconnection layer disposed on the semiconductor substrate;
a first passivation layer disposed on the interconnection layer;
a plurality of conductive pads disposed on the first passivation layer and electrically connected to the interconnection layer;
at least one inductor pattern disposed on the first passivation layer and electrically connected to the interconnection layer, wherein a top surface of the at least one inductor pattern is leveled with a top surface of the plurality of conductive pads, and wherein the at least one inductor pattern comprises:
a first terminal disposed on the first passivation layer and electrically connected to the interconnection layer;
a first conductive line joined with the first terminal, wherein a width of the first conductive line is d1 and a width of the first terminal is d2;
a second terminal disposed on the first passivation layer and electrically connected to the interconnection layer;
a second conductive line joined with the second terminal, wherein a width of the second conductive line is d3 and a width of the second terminal is d4, and the width d4 is greater than the widths d1, d2 and d3; and
a plurality of conductive coils disposed on the first passivation layer and joining the first conductive line to the second conductive line;
a second passivation layer disposed on the plurality of conductive pads and the at least one inductor pattern, and covering and directly contacting the plurality of conductive pads and the at least one inductor pattern; and
a plurality of conductive posts disposed on the second passivation layer and electrically and directly connected to the plurality of conductive pads, and wherein the second passivation layer partially cover sidewalls of the plurality of conductive posts.

12. The semiconductor device according to claim 11, wherein the plurality of conductive pads and the at least one inductor pattern are located at a same level height on the first passivation layer.

13. The semiconductor device according to claim 11, wherein the plurality of conductive coils comprises an outer coil joined with the first conductive line, an inner coil joined with the second conductive line, and intermediate coils joining the outer coil to the inner coil, and wherein the second conductive line is spaced apart from a first side of the inner coil in a first direction by distance Y, the distance Y is equal to a spacing of loops of the plurality of conductive coils, the second terminal is spaced apart from a second side of the inner coil in a second direction by distance X1, and a relationship of the distance X1 to the distance Y satisfies: X1>1.25Y.

14. The semiconductor device according to claim 11, wherein a plurality of connecting elements is joined with a bottom surface of the second terminal, and the plurality of connecting elements is electrically connected to the interconnection layer.

15. The semiconductor device according to claim 11, wherein a plurality of auxiliary connecting elements is joined with a bottom surface of the plurality of conductive coils, and the plurality of auxiliary connecting elements is electrically connected to the interconnection layer.

16. The semiconductor device according to claim 11, further comprising a plurality of conductive terminals disposed on and electrically connected to the plurality of conductive posts.

17. The semiconductor device according to claim 11, further comprising a capacitor embedded in the interconnection layer, wherein the capacitor is overlapped with the at least one inductor pattern along a build-up direction of the semiconductor device.

18. A method of fabricating a semiconductor device, comprising:
providing a semiconductor substrate;
forming an interconnection layer on the semiconductor substrate;
forming a first passivation layer on the interconnection layer, and patterning the first passivation layer to form a plurality of first openings;
forming a conductive layer on the first passivation layer, wherein the conductive layer is electrically connected to the interconnection layer through the plurality of first openings;
patterning the conductive layer to form a plurality of conductive pads and at least one inductor pattern, wherein the at least one inductor pattern comprises:
a first conductive line joined with a first terminal;
a second conductive line joined with a second terminal; and
a plurality of conductive coils joining the first conductive line to the second conductive line, wherein the plurality of conductive coils comprises an outer coil joined with the first conductive line, an inner coil joined with the second conductive line and the outer coil, and wherein the second conductive line is spaced apart from a first side of the inner coil in a first direction by distance Y, the distance Y is equal to a spacing of loops of the plurality of conductive coils, the second terminal is spaced apart from a second side of the inner coil in a second direction by distance X1, and a relationship of the distance X1 to the distance Y satisfies: X1>1.25Y;
forming a plurality of auxiliary connecting elements along with the conductive layer, wherein after patterning the conductive layer to form the plurality of conductive pads and the at least one inductor pattern, the plurality of auxiliary connecting elements is joined with a bottom surface of the plurality of conductive coils, wherein the plurality of auxiliary connecting elements comprises a first portion of auxiliary connecting elements connected to the outer coil and a second portion of auxiliary connecting elements connected to the inner coil, and a number of the first portion of auxiliary connecting elements is equal to a number of the second portion of auxiliary connecting elements;
forming a second passivation layer on the plurality of conductive pads and the at least one inductor pattern, and patterning the second passivation layer to form a plurality of second openings revealing the plurality of conductive pads; and
forming a plurality of conductive posts in the plurality of second openings, wherein the plurality of conductive posts is electrically connected to the plurality of conductive pads through the plurality of second openings.

19. The method according to claim 18, further comprises performing a heating process to heat the plurality of conductive pads, wherein the heating process is performed after patterning the second passivation layer at a temperature range between 390° C. to 410° C.

20. The method according to claim 18, further comprising forming a plurality of connecting elements along with the conductive layer, wherein after patterning the conductive layer to form the plurality of conductive pads and the at least one inductor pattern, two or more of the plurality of connecting elements are joined with a bottom surface of the second terminal.

* * * * *